United States Patent
Han et al.

(10) Patent No.: US 10,153,425 B2
(45) Date of Patent: Dec. 11, 2018

(54) SPIN LOGIC DEVICE AND ELECTRONIC EQUIPMENT INCLUDING SAME

(71) Applicant: Institute of Physics, Chinese Academy of Sciences, Beijing (CN)

(72) Inventors: Xiufeng Han, Beijing (CN); Caihua Wan, Beijing (CN); Xuan Zhang, Beijing (CN)

(73) Assignee: INSTITUTE OF PHYSICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 15/256,262

(22) Filed: Sep. 2, 2016

(65) Prior Publication Data

US 2017/0077392 A1 Mar. 16, 2017

(30) Foreign Application Priority Data

Sep. 10, 2015 (CN) .......................... 2015 1 0574526
Jan. 29, 2016 (CN) .......................... 2016 1 0064129
Mar. 30, 2016 (CN) .......................... 2016 1 0190767

(51) Int. Cl.
| | |
|---|---|
| H01L 43/06 | (2006.01) |
| H01L 43/04 | (2006.01) |
| G11C 11/16 | (2006.01) |
| H01L 43/08 | (2006.01) |
| H01L 43/10 | (2006.01) |
| H01L 27/22 | (2006.01) |

(52) U.S. Cl.
CPC ........ *H01L 43/065* (2013.01); *G11C 11/1673* (2013.01); *H01L 27/222* (2013.01); *H01L 43/04* (2013.01); *H01L 43/08* (2013.01); *H01L 43/10* (2013.01)

(58) Field of Classification Search
None
See application file for complete search history.

(56) References Cited

U.S. PATENT DOCUMENTS

2014/0169088 A1* 6/2014 Buhrman ................ G11C 11/18
365/158

* cited by examiner

*Primary Examiner* — James G Norman
(74) *Attorney, Agent, or Firm* — Chang & Hale LLP

(57) ABSTRACT

The present invention relates to a spin logic device and an electronic equipment comprising the same. A spin logic device may include a Spin Hall effect (SHE) layer formed of a conductive material having Spin Hall effect and configured to receive a first logic input current and a second logic input current, the first logic input current and the second logic input current both being an in-plane current, a magnetic tunnel junction provided on the SHE layer comprising a free magnetic layer in contact with the SHE layer, a barrier layer disposed on the free magnetic layer, and a reference magnetic layer disposed on the barrier layer, and a current wiring in connection to the reference magnetic layer side of the magnetic tunnel junction, the current wiring being in cooperation with the SHE layer to apply a read current passing through the magnetic tunnel junction therebetween.

20 Claims, 16 Drawing Sheets

SPIN LOGIC DEVICE AND ELECTRONIC EQUIPMENT INCLUDING SAME

CROSS-REFERENCE TO RELATED APPLICATIONS

This application claims priority to Chinese Patent Application No. 201510574526.5 entitled "Current-Driving Magnetic Random Access Memory and Spin Logic Device" filed on Sep. 10, 2015, Chinese Patent Application No. 201610064129.8 entitled "Spin Logic Device and Electronic Equipment Including Same" filed on Jan. 29, 2016, and Chinese Patent Application No. 201610190767.4 entitled "Programmable Spin Logic Device and Electronic Equipment Including Same" filed on Mar. 30, 2016, the disclosures of which are incorporated herein by reference in their entireties.

FIELD OF THE INVENTION

The present invention generally relates to spintronics, and in particular, to a spin logic device utilizing Spin Hall effect and an electronic equipment including the spin logic device.

BACKGROUND

Spin logic device, also known as magnetic logic device, is a kind of logic device that is formed with magnetic materials and operates by using electron spin characteristics of the magnetic materials. When compared to traditional semiconductor logic devices, this spin-polarized transport based logic device has such advantages as high operating frequency, infinite times of reconfiguration, non-volatility of logic data, radiation resistance, compatibility with Magnetic Random Access Memories (MRAMs), etc., and thus it is considered as a promising candidate for the next generation logic devices that substitutes the traditional semiconductor logic devices.

FIG. 1 shows a prior art spin logic device 100. As shown in FIG. 1, the spin logic device 100 includes a so-called magnetic tunnel junction MTJ core unit that has two ferromagnetic layers FM1 and FM2 with an insulating barrier layer I interposed therebetween. Three input lines A, B and C are provided over the magnetic tunnel junction MTJ, and two output lines Out are provided on upper and lower sides of the magnetic tunnel junction MTJ, respectively. The two ferromagnetic layers FM1 and FM2 of the magnetic tunnel junction MTJ may have different coercive forces, and the three input lines A, B and C each may be provided with an input current of the same level. When only one of the three input lines, for example, the input line A, is provided with the input current, neither the ferromagnetic layer FM1 nor the ferromagnetic layer FM2 will have its magnetization reversed. When two of the three input lines, for example, the input lines A and B, are provided with the input current in the same direction, one of the ferromagnetic layers FM1 and FM2 that has a lower coercive force will have its magnetization reversed, while the other will not. When each of the three input lines A, B and C is provided with the input current in the same direction, both ferromagnetic layers FM1 and FM2 will have their magnetization reversed. Therefore, the MTJ may be configured into 4 different initial states among which two are parallel states where the ferromagnetic layers FM1, FM2 have magnetizations parallel with each other and two are anti-parallel states where the ferromagnetic layers FM1, FM2 have magnetizations anti-parallel with each other. In the parallel states, the magnetic tunnel junction MTJ has a lower resistance; while in the antiparallel states, the magnetic tunnel junction MTJ has a higher resistance. As such, a plurality of different logic states may be achieved. The operation of the magnetic logic device generally includes two steps. The first is a resetting step to place the magnetic tunnel junction MTJ into a predetermined initial state by activating one or more of the input lines. The second is a logic operation step to apply an input current on one or two of the input lines and then or simultaneously read out resistance (or voltage, current) of the MTJ by applying a reading current between the two output lines.

Unfortunately, the prior art spin logic device 100 of FIG. 1 has several shortcomings. For example, it contains too many wirings and thus a very complex structure such that the manufacture thereof faces many challenges. In addition, since the spin logic device 100 relies completely on the Oersted field generated by a current passing through the input lines to reverse magnetization of the ferromagnetic layers, it has to use a large current in order to generate an Oersted field strong enough to reverse the magnetization, leading to high power consumption. These shortcomings have obstructed the practical application of the prior art spin logic devices in modern electronics equipments.

SUMMARY OF THE INVENTION

Some embodiments relate to a spin logic device comprising a Spin Hall effect (SHE) layer formed of a conductive material exhibiting a spin Hall effect and configured to receive a first logic input current and a second logic input current both of which are in-plane currents, a magnetic tunnel junction disposed on the SHE layer comprising a free magnetic layer in contact with the SHE layer, a barrier layer formed on the free magnetic layer, and a reference magnetic layer formed on the barrier layer, and a current wiring in connection with the reference magnetic layer side of the magnetic tunnel junction operating together with the SHE layer to pass a read current through the magnetic tunnel junction.

DETAILED DESCRIPTION OF THE EMBODIMENTS

Figure 1:
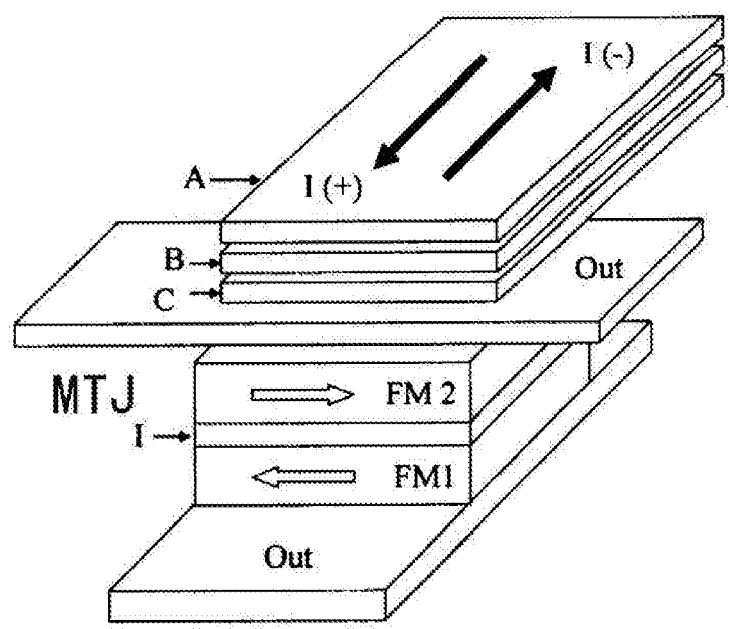
FIG. 1 is an illustration of a prior art spin logic device.
Figure 2:
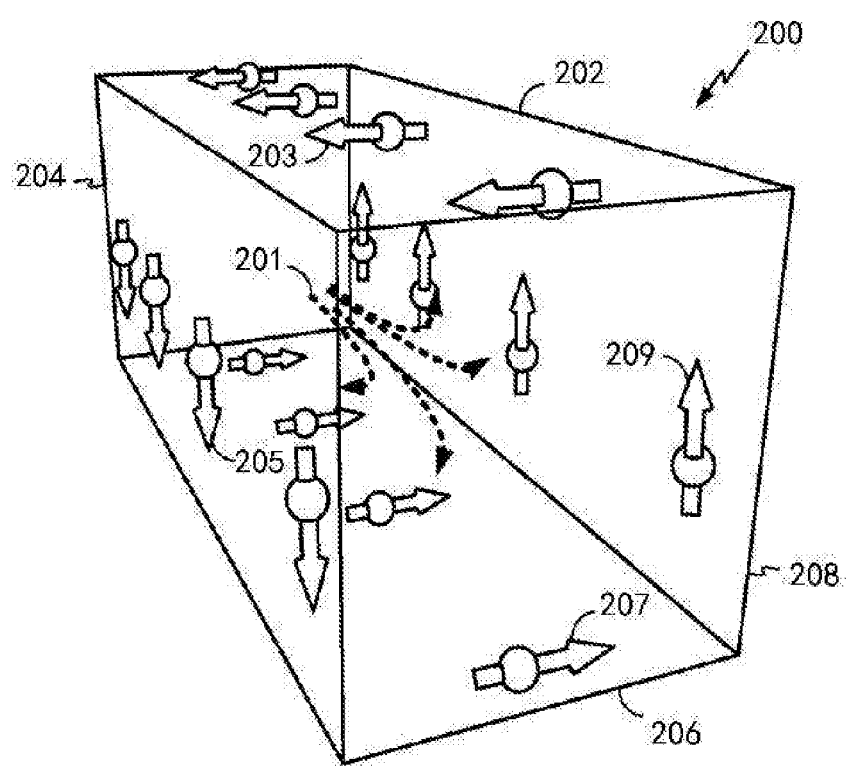
FIG. 2 is an illustration of a conductor demonstrating the Spin Hall effect.

FIG. 2 is a schematic diagram displaying the Spin Hall effect. Referring to FIG. 2, while flowing through a particular conductor 200, electrons 201 are spin-polarized on surfaces 202, 204, 206, and 208 of the conductor 200 due to spin-orbit coupling, as shown by arrows 203, 205, 207, and 209, respectively. This phenomenon is known as Spin Hall effect. Examples of materials exhibiting Spin Hall effect include, but not limited to metals or alloys such as Pt, Au, Ta, Pd, Ir, W, Bi, Pb, Hf, IrMn, PtMn, AuMn, topological insulators such as $Bi_2Se_3$ and $Bi_2Te_3$, and rare earth materials such as Y, La, Ce, Pr, Nd, Sm, Eu, Gd, Te, Dy, Ho, Er, Tm, Yi, Lu, among which Y, Nd, Sm, Eu, Gd, Te, Dy, Ho, Er and Tm are preferable as they have stronger spin-orbit coupling and hence a larger Spin Hall angle. It is also known that for different Spin Hall effect materials, the spin polarization of electrons may be in opposite directions even when the current is applied in the same direction.

Figure 3:
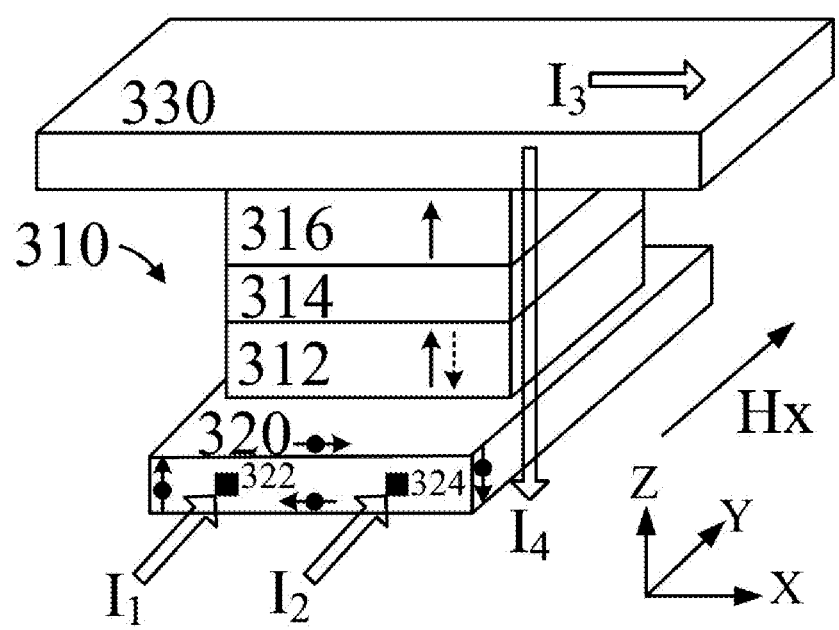
FIG. 3 is an illustration of a spin logic device in accordance with an exemplary embodiment of the present invention.

The inventor found out that the Spin Hall effect shown in FIG. 2 may be used in spin logic devices. FIG. 3 shows a schematic diagram of a spin logic device 300 according to an embodiment of the present invention. As shown in FIG. 3, the spin logic device 300 may include a magnetic tunnel junction 310, a Spin Hall effect (SHE) layer 320 provided below the magnetic tunnel junction 310, and a current wiring 330 provided above the magnetic tunnel junction 310.

The SHE layer 320 may be connected to wirings (not shown) to receive input currents. For example, as shown in FIG. 3, the SHE layer 320 may be provided with connecting terminals 322 and 324 on its −Y side to receive a first input current $I_1$ and a second input current $I_2$, respectively, and the first input current $I_1$ and the second input current $I_2$ are both in-plane currents flowing in the layer plane of the SHE layer 320 rather than perpendicularly through the SHE layer 320. In the embodiment shown in FIG. 3, the first input current $I_1$ and the second input current $I_2$ are in the same direction, i.e., the Y-axis direction. Although not shown in FIG. 3, the SHE layer 320 may also be provided with two connecting terminals on its +Y side for conduction of the first input current $I_1$ and the second input current $I_2$, respectively. The SHE layer 320 may be formed of a conductive material with strong spin-orbit coupling such that when the input currents such as the currents $I_1$ and/or $I_2$ pass through the SHE layer 320, a spin-polarized current appears on the surface of the conductive material due to the Spin Hall effect. In the spin-polarized current, electrons have a spin direction regularly aligned, as shown in FIG. 3 by the dotted-arrows around the SHE layer 320, the dot representing an electron, and the arrow representing a spin direction of the electron. Although FIG. 3 shows electrons on the surface of the SHE layer 320 have a clockwise spin direction with respect to currents $I_1$ and/or $I_2$ of a +Y direction, the spin of electrons may also be in an anti-clockwise direction depending on the specific material of the SHE layer 320. Examples of conductive materials with a strong spin-orbit coupling that may be used to form the SHE layer 320 include, but not limited to metals or alloys such as Pt, Au, Ta, Pd, Ir, W, Bi, Pb, Hf, IrMn, PtMn, AuMn, topological insulators such as $Bi_2Se_3$ and $Bi_2Te_3$, and rare earth materials such as Y, La, Ce, Pr, Nd, Sm, Eu, Gd, Te, Dy, Ho, Er, Tm, Yi, Lu, among which Y, Nd, Sm, Eu, Gd, Te, Dy, Ho, Er and Tm are preferable as they have a stronger spin-orbit coupling and hence a larger Spin Hall angle. It would be appreciated that materials that may be used to form the SHE layer 320 are not limited to the above-mentioned examples, and any known or future developed conductive materials that can exhibit the Spin Hall effect may be used to form the SHE layer 320. In addition, the SHE layer 320 may also be formed of any combination of these materials. In some embodiments of the present invention, the SHE layer 320 may have a thickness in a range of 0.5 nm to 30 nm, preferably in a range of 0.6 nm to 10 nm, so as to provide excellent resistance characteristics and spin-transfer torque effect.

The magnetic tunnel junction 310 is disposed on and in contact with the SHE layer 320. Specifically, the magnetic tunnel junction 310 may include a free magnetic layer 312, a reference magnetic layer 316 and a barrier layer 314 interposed between the free magnetic layer 312 and the reference magnetic layer 316. In this case, the free magnetic layer 312 is in direct contact with the SHE layer 320. Both the free magnetic layer 312 and the reference magnetic layer 316 may be formed of ferromagnetic materials such as Co, Fe, Ni and alloys including Co, Fe, or Ni such as CoFe, NiFe, CoFeB, and the like. The free magnetic layer 312 may be formed of a ferromagnetic material with a lower coercive force and/or magnetic anisotropy energy such that magnetization of the free magnetic layer 312 may easily rotate with respect to an external magnetic field, whereas the reference magnetic layer 316 may be formed of a ferromagnetic material with a higher coercive force and/or magnetic anisotropy energy such that its magnetization is not likely to rotate with the external magnetic field. In some embodiments, the magnetization of the reference magnetic layer 316 may be fixed. For example, it may be fixed by a pinning configuration or a self-pinning configuration. In the pinning configuration, a pinning layer (not shown) may be formed on the reference magnetic layer 316 to pin/fix the magnetization of the reference magnetic layer 316. The pinning layer may be formed of an anti-ferromagnetic material such as IrMn and have a thickness in a range of 1 nm to 30 nm. In the self-pinning configuration, alternatively, the reference magnetic layer 316 may be formed of a hard magnetic material with a higher coercive force, or the reference magnetic layer 316 may be formed to a larger thickness so as to achieve a larger coercive force. In this case, the reference magnetic layer 316 has its magnetization pinned/fixed by itself and the pinning layer may be omitted.

Referring to FIGS. 2-3, when a spin non-polarized current passes through the SHE layer 320 in an in-plane direction, the SHE layer 320 develops a spin-polarized current in its surface in contact with the free magnetic layer 312. Meanwhile, a pure spin flow may be injected from the SHE layer 320 into the free magnetic layer 312, which may exert a spin-transfer torque (STT) to the magnetization of the free magnetic layer 312 such that the magnetization direction of the free magnetic layer 312 may be altered. It will be discussed in detail with reference to some specific examples.

Continuing referring to FIG. 3, in an example, both the free magnetic layer 312 and the reference magnetic layer 316 may have magnetization along the vertical direction (i.e., perpendicular to the layer plane, or along the Z direction). In other words, the free magnetic layer 312 and the reference magnetic layer 316 each may have a magnetic easy axis in the vertical direction (the Z direction). In some examples, the free magnetic layer 312 may have a thickness in a range from 0.5 nm to 16 nm, preferably from 0.8 nm to 8 nm, and the reference magnetic layer 316 may have a thickness in a range from 0.5 nm to 20 nm, preferably from 0.8 nm to 10 nm.

It would be appreciated that although various embodiments and examples of the present invention are described herein in the context of the free magnetic layer and the reference magnetic layer both having the perpendicular magnetization, the principle of the present invention may also be applicable to cases in which the free magnetic layer and the reference magnetic layer have in-plane magnetization. As compared to the in-plane magnetization configuration, the perpendicular magnetization configuration allows the magnetic tunnel junction to be formed with a smaller size, which in turn increases the integration level of devices, and hence it is preferable.

Although the configuration of the magnetic tunnel junction 310 has been described herein with reference to FIG. 3, those skilled in the art will appreciate that many variations, modifications, or improvements may be made to the magnetic tunnel junction 310. For example, in addition to the rectangular shape shown in FIG. 3, the magnetic tunnel junction 310 may also be formed into other shapes such as circle, ellipse, square, ring, or other polygonal shapes. Furthermore, the magnetic tunnel junction 310 may be formed with more or less layers. The present invention intends to encompass all such variations, modifications and improvements of the magnetic tunnel junction as long as they fall within the scope of the appended claims and their equivalents.

The current wiring 330 may extend over the magnetic tunnel junction 310 and be electrically connected to the magnetic tunnel junction 310. In the embodiment shown in FIG. 3, the current wiring 330 may directly contact the magnetic tunnel junction 310. In some other embodiments, the current wiring 330 may be formed over the magnetic tunnel junction 310 and is connected to the magnetic tunnel junction 310 through, for example, a conductive plug. The current wiring 330 may extend in a direction that intersects the direction of the input currents $I_1$ and $I_2$ applied to the SHE layer 320. In a preferable example, the current wiring 330 may extend in a direction that is perpendicular to the direction of the input currents $I_1$ and $I_2$ applied to the SHE layer 320. For example, in the embodiment shown in FIG. 3, the input currents $I_1$ and $I_2$ are in the Y direction, while the current wiring 330 extends in the X direction. In some other embodiments, the current wiring 330 may form an angle in a range of 45° to 135° with respect to the direction of the input currents $I_1$ and $I_2$. It can be understood from the following description of the operating principle that the perpendicular configuration is preferable, but the intersection configuration has also a perpendicular component and therefore it is also possible.

In the embodiment shown in FIG. 3, the input currents $I_1$ and $I_2$ are parallel with each other. In some other embodiments, however, the input currents $I_1$ and $I_2$ may form a certain angle with respect to each other, or even be perpendicular to each other. For example, the input current $I_1$ may be in the Y direction, while the input current $I_2$ may be in the X direction. In this case, the current wiring 330 may preferably extend in a direction perpendicular to the combination of the input currents $I_1$ and $I_2$.

The operating principle of the spin logic device 300 will be briefly discussed below with reference to FIG. 3. As mentioned above, when a current such as the current $I_1$ and/or $I_2$ passes through the SHE layer 320, a pure spin flow is generated from the SHE layer 320 into the free magnetic layer 312 due to the Spin Hall effect, which applies a spin-transfer torque to the magnetization of the free magnetic layer 312. At the same time, a current $I_3$ may be applied to the current wiring 330, which generates an Oersted field Hx at the free magnetic layer 312. The Oersted field Hx applies a magnetic torque to the free magnetic layer 312. Under a combined effect of the pure spin flow and the Oersted field Hx, the magnetization of the free magnetic layer 312 is possible to be reversed. By properly setting directions of the input currents $I_1$, $I_2$ or the current $I_3$, the magnetization of the free magnetic layer 312 may be switched to a desired direction, such as the +Z direction or the −Z direction. In this embodiment, since both the spin flow generated from the Spin Hall effect and the Oersted field generated by the current wiring are used in cooperation with each other to reverse the magnetization of the free magnetic layer 312, an overall current required to reverse the magnetization of the free magnetic layer 312 may be reduced and the structure of the spin logic device may be significantly simplified. In addition, while utilizing the spin flow and the Oersted field to reverse the magnetization of the free magnetic layer 312, the spin flow and the Oersted field may be adjusted independently such that more flexibility of operation may be achieved.

FIGS. 4A, 4B, 4C, 4D and 4E are signal diagrams showing logical operations of the spin logic device 300 of FIG. 3. Various logical operations of the spin logic device 300 will be described in detail below with reference to FIG. 3 and FIGS. 4A-4E.

Figure 4A:
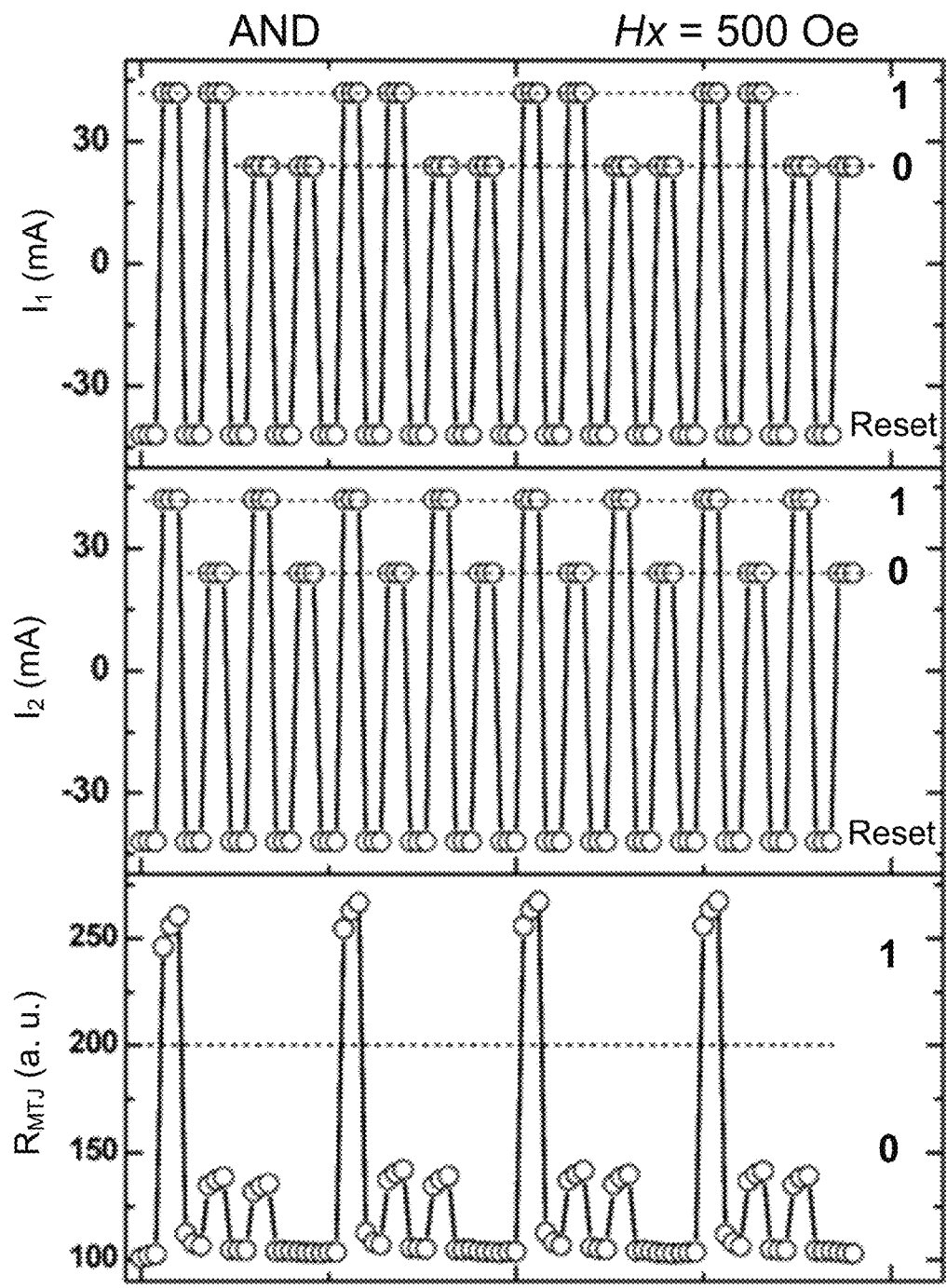
FIGS. 4A, 4B, 4C, 4D, and 4E are signal diagrams showing logical operations of the spin logic device of FIG. 3.

Referring first to FIG. 4A, there is shown a signal graph of the spin logic device 300 of FIG. 3 that is configured as an "AND" gate to perform a logical "AND" operation. A truth table of the "AND" gate is also shown in the below Table 1. To behave as an "AND" gate, the magnetic tunnel junction 310 may be configured to have an initial parallel state. During the logical AND operation, the current $I_3$ may be applied to the current wiring 330 to induce a relatively small Oersted magnetic field at a position where the free magnetic layer 312 locates, for example, an Oersted field of 500 Oe as shown in FIG. 4A. It would be easily appreciated that during the logical AND operation, the current $I_3$ may be always applied onto the current wiring 330, or it may be applied only when the first input current $I_1$ and the second input current $I_2$ both are applied so as to reduce power consumption.

TABLE 1

| Truth table of logical "AND" | | |
|---|---|---|
| Input Current $I_1$ | Input Current $I_2$ | Output |
| 1 | 1 | 1 |
| 1 | 0 | 0 |
| 0 | 1 | 0 |
| 0 | 0 | 0 |

In the first operation from left in FIG. 4A, the first input current $I_1$ and the second input current $I_2$ applied on the SHE layer 310 each are a relatively large current in a positive direction, which corresponds to a logical input "1". Under the two large currents in cooperation with the 500 Oe Oersted field, the magnetization of the free magnetic layer 312 may be reversed such that the magnetic tunnel junction 310 enters into an antiparallel state corresponding to a high resistance. Then, a read current $I_4$, also referred to as an output current $I_4$, may be applied between the current wiring 330 and the SHE layer 310, passing perpendicularly through the magnetic tunnel junction 310. From the read current $I_4$, it may be determined that the magnetic tunnel junction 310 is in the high resistance state, which corresponds to a logical state "1". It would be easily appreciated that the read current $I_4$ may also be applied after application of the input currents $I_1$ and $I_2$, not necessarily at the same time of the input currents $I_1$ and $I_2$ since the magnetic tunnel junction 310 is a non-volatile device that may maintain its magnetization state.

A reset operation may be carried out on the magnetic tunnel junction 310 before and/or after each logical operation so as to reset the magnetic tunnel junction 310 to the initial parallel state. In the example shown in FIG. 4A, the reset operation is carried out by applying large currents $I_1$ and $I_2$ in an opposite direction in conjunction with the 500 Oe Oersted field, which resets the magnetic tunnel junction 310 to the initial parallel state.

In the second operation from left in FIG. 4A, the first input current $I_1$ applied on the SHE layer 310 is still a relatively large current in the positive direction, which corresponds to the logical state "1", while the second input current $I_2$ becomes a relatively small current applied in the positive direction, which corresponds to the logical state "0". Since one of the input currents becomes a small current, the input currents, even in cooperation with the 500 Oe magnetic field, cannot reverse the magnetization of the free magnetic layer 312. Therefore, the magnetic tunnel junction 310 remains in the initial parallel state. When the read current $I_4$ is applied passing perpendicularly through the magnetic tunnel junction 310, it may be determined that the magnetic tunnel junction 310 is still in a low resistance state, which corresponds to the logical state "0".

Similarly, in the third operation from left in FIG. 4A, the first input current $I_1$ becomes a relatively small current in the positive direction while the second input current $I_2$ is a relatively large current in the positive direction, and in the fourth operation from left in FIG. 4A, both the first input current $I_1$ and the second input current $I_2$ become a relatively small current in the positive direction. Since one or both of the input currents $I_1$, $I_2$ are small, neither of third and fourth operations can reverse the magnetization of the free magnetic layer 312. Therefore, the magnetic tunnel junction 310 remains in the low resistance state that corresponds to the logical state "0".

As discussed above, the spin logic device 300 has accomplished the logical "AND" operation shown in Table 1. In the "AND" operation, since the Oersted field provided by the current $I_3$ is small (for example, 500 Oe), the first and second input currents $I_1$, $I_2$ cannot reverse the magnetization of the free magnetic layer 312 when any one of them is a small current corresponding to a logical "0", and thus the magnetic tunnel junction 310 would remain in the initial parallel state that corresponds to a logical "0". In other words, only when both the first and second input currents $I_1$, $I_2$ are large currents corresponding to logical "1", they, in cooperation with the Oersted field of 500 Oe, can reverse the magnetization of the free magnetic layer 312, and the magnetic tunnel junction 310 may be switched from the initial parallel state to the anti-parallel state that corresponds to the logical "1".

Figure 4B:
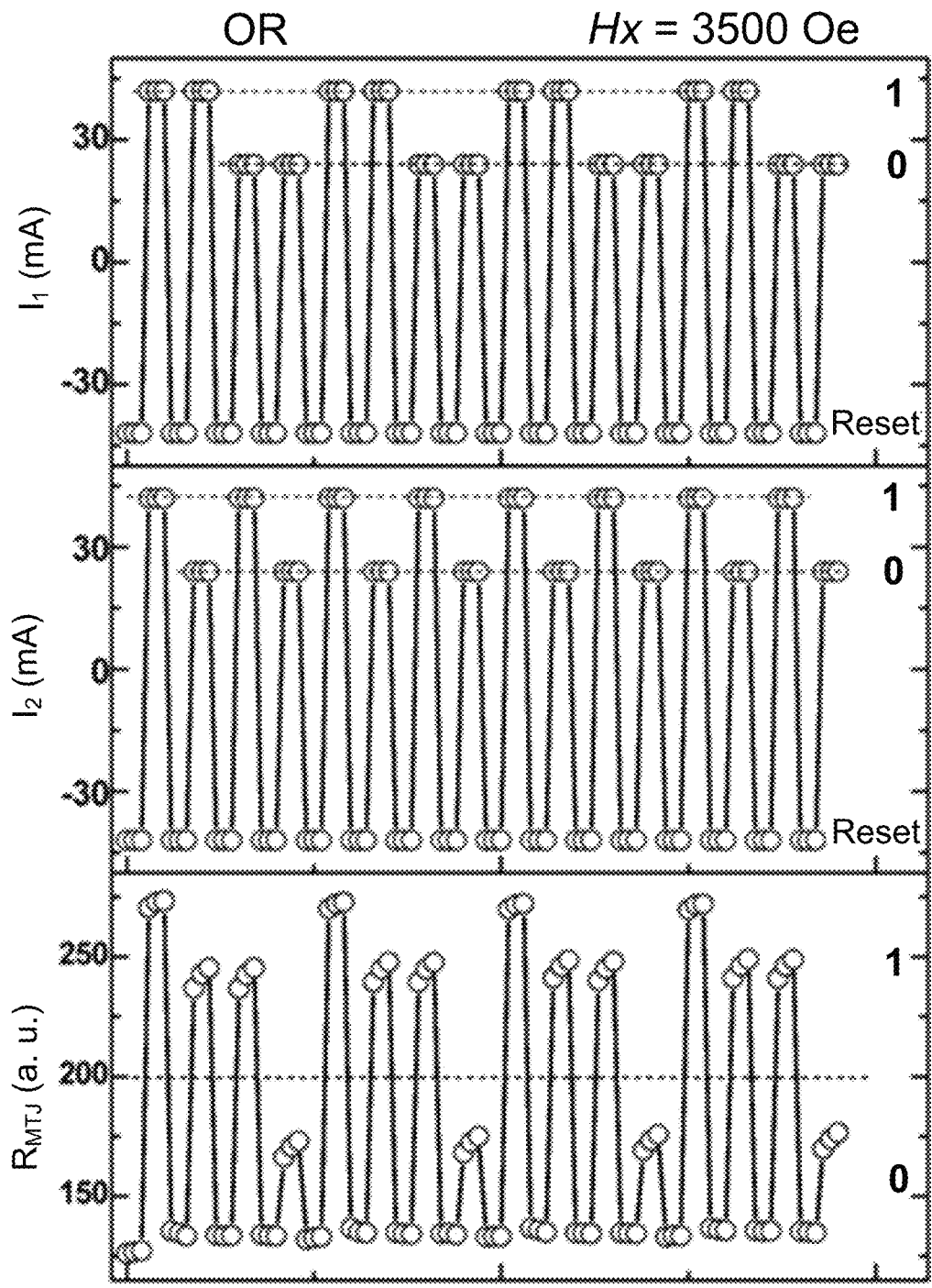

FIG. 4B shows a signal graph of the spin logic device 300 of FIG. 3 that is configured as an "OR" gate to perform a logical "OR" operation. A truth table of the "OR" gate is also shown in the below Table 2. To behave as the "OR" gate, the magnetic tunnel junction 310 may be configured to have an initial parallel state. During the logical OR operation, the current $I_3$ may be applied to the current wiring 330 to induce a relatively large Oersted magnetic field at the position where the free magnetic layer 312 locates, for example, an Oersted field of 3500 Oe as shown in FIG. 4B. It would be easily appreciated that during the logical OR operation, the current $I_3$ may be always applied onto the current wiring 330, or it may be applied only when the first input current $I_1$ and the second input current $I_2$ both are applied so as to reduce the power consumption.

TABLE 2

Truth table of logical "OR"

| Input Current $I_1$ | Input Current $I_2$ | Output |
|---|---|---|
| 1 | 1 | 1 |
| 1 | 0 | 1 |
| 0 | 1 | 1 |
| 0 | 0 | 0 |

In the first operation from left in FIG. 4B, the first input current $I_1$ and the second input current $I_2$ applied to the SHE layer 310 each are a relatively large current in the positive direction, which corresponds to the logical "1". Under the two large currents in cooperation with the Oersted field of 3500 Oe, the magnetization of the free magnetic layer 312 may be reversed such that the magnetic tunnel junction 310 enters into the anti-parallel state. Then, the read current $I_4$ may be applied passing perpendicularly through the magnetic tunnel junction 310. From the read current $I_4$, it may be determined that the magnetic tunnel junction 310, which is in the anti-parallel state, has a high resistance that corresponds to the logical "1".

Also, a reset operation may be carried out before and/or after each logic operation so as to reset the magnetic tunnel junction 310 to the initial parallel state. In the example shown in FIG. 4B, the reset operation may be carried out by applying large currents $I_1$ and $I_2$ in the opposite direction in conjunction with the Oersted field of 3500 Oe, which may reset the magnetic tunnel junction 310 to the initial parallel state.

In the second operation from left in FIG. 4B, as shown, the first input current $I_1$ applied to the SHE layer 310 is still a relatively large current in the positive direction that corresponds to the logical "1", while the second input current $I_2$ becomes a relatively small current in the positive direction that corresponds to the logical "0". Although one of the input currents (the second input current $I_2$ in this example) is small (corresponding to the logical "0"), since the Oersted field generated by the current $I_3$ is sufficiently high (3500 Oe in this example) the input currents $I_1$ and $I_2$, in cooperation with the Oersted field, can reverse the magnetization of the free magnetic layer 312, thereby making the magnetic tunnel junction 310 enter into the anti-parallel state. As a result, with the read current $I_4$ passing through the magnetic tunnel junction 310, it can be determined that the magnetic tunnel junction 310 is in the high resistance state, corresponding to the logical "1".

Similarly, in the third operation shown in FIG. 4B, the first input current $I_1$ is a relatively small current in the positive direction while the second input current $I_2$ is a relatively large current in the positive direction. In this case, the first and second input currents $I_1$ and $I_2$, in cooperation with the large Oersted field of 3500 Oe, can reverse the magnetization of the free magnetic layer 312, thereby making the magnetic tunnel junction 310 enter into the anti-parallel state. As a result, with the read current $I_4$ passing through the magnetic tunnel junction 310, it can be determined that the magnetic tunnel junction 310 is in the high resistance state, corresponding to the logical "1".

In the fourth operation, both the first input current $I_1$ and the second input current $I_2$ are small currents in the positive direction. In this case, even in cooperation with the large Oersted field of 3500 Oe generated by the current $I_3$, the first and second input current $I_1$ and $I_2$ still cannot reverse the magnetization of the free magnetic layer 312. Thus, the magnetic tunnel junction 310 maintains its initial parallel state. When the read current $I_4$ is applied to the magnetic tunnel junction 310 between the current wiring 330 and the SHE layer 320, it can be determined that the magnetic tunnel junction 310 is in the low resistance state corresponding to the logical "0".

As described above, the spin logic device 300 has accomplished the logical "OR" operation shown in Table 2. During the logical "OR" operation, since the current I3 induces a relatively large Oersted field (3500 Oe in this example), the first and second input currents $I_1$, $I_2$, in cooperation with the Oersted field, can reverse the magnetization of the free magnetic layer 312 even when one of them is a relatively small current. On the other hand, if both the first input current $I_1$ and the second input current $I_2$ are small currents (corresponding to the logical "0"), it is impossible for them to reverse the magnetization of the free magnetic layer 312 even in cooperation with the Oersted field of 3500 Oe, and the magnetic tunnel junction 310 will remain in the initial parallel state that corresponds to the logical "0".

Figure 4C:
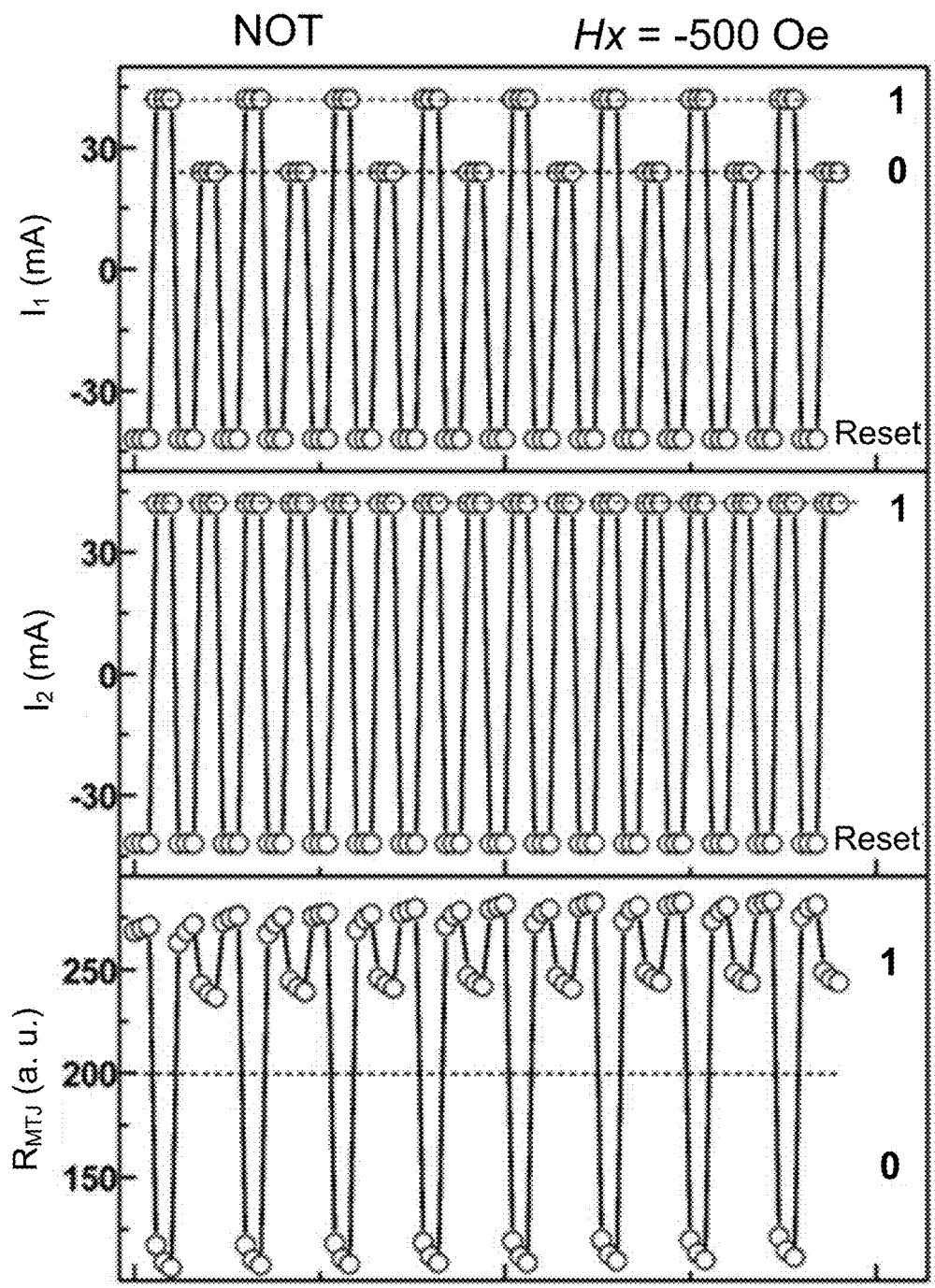

FIG. 4C shows a signal graph of the spin logic device 300 of FIG. 3 that is configured as a "NOT" gate to perform a logical "NOT" operation. A truth table of the "NOT" gate is also shown in the below Table 3. To behave as the "NOT" gate, the magnetic tunnel junction 310 may be configured to have an initial anti-parallel state. During the logical NOT operation, the current wiring 330 may be supplied with a reversed current $I_3$ to generate a Oersted magnetic field of about −500 Oe at a position where the free magnetic layer 312 locates, and the second input current $I_2$ may be set as a relatively large current that corresponds to the logical "1". Then, in the first operation from left as shown in FIG. 4C, the first input current $I_1$ is provided as a relatively large current corresponding to the logical "1", which causes the magnetization of the free magnetic layer 312 to be reversed and thus the magnetic tunnel junction 310 switches from the initial anti-parallel state to the parallel state. Consequently, a low resistance state, which corresponds to the logical "0", may be read out in the subsequent reading step using the read current $I_4$. In the second operation from left, the first input current $I_1$ is provided as a relatively small current corresponding to the logical "0", which cannot reverse the magnetization of the free magnetic layer 312. As a result, the magnetic tunnel junction 310 remains in the initial anti-parallel state. Consequently, a high resistance state, which corresponds to the logical "1", may be read out in the subsequent reading step using the read current $I_4$. As such, the spin logic device 300 has accomplished the logical "NOT" operation as shown in Table 3.

TABLE 3

Truth table of logical "NOT"

| Input Current $I_1$ | Output |
|---|---|
| 1 | 0 |
| 0 | 1 |

Figure 4D:
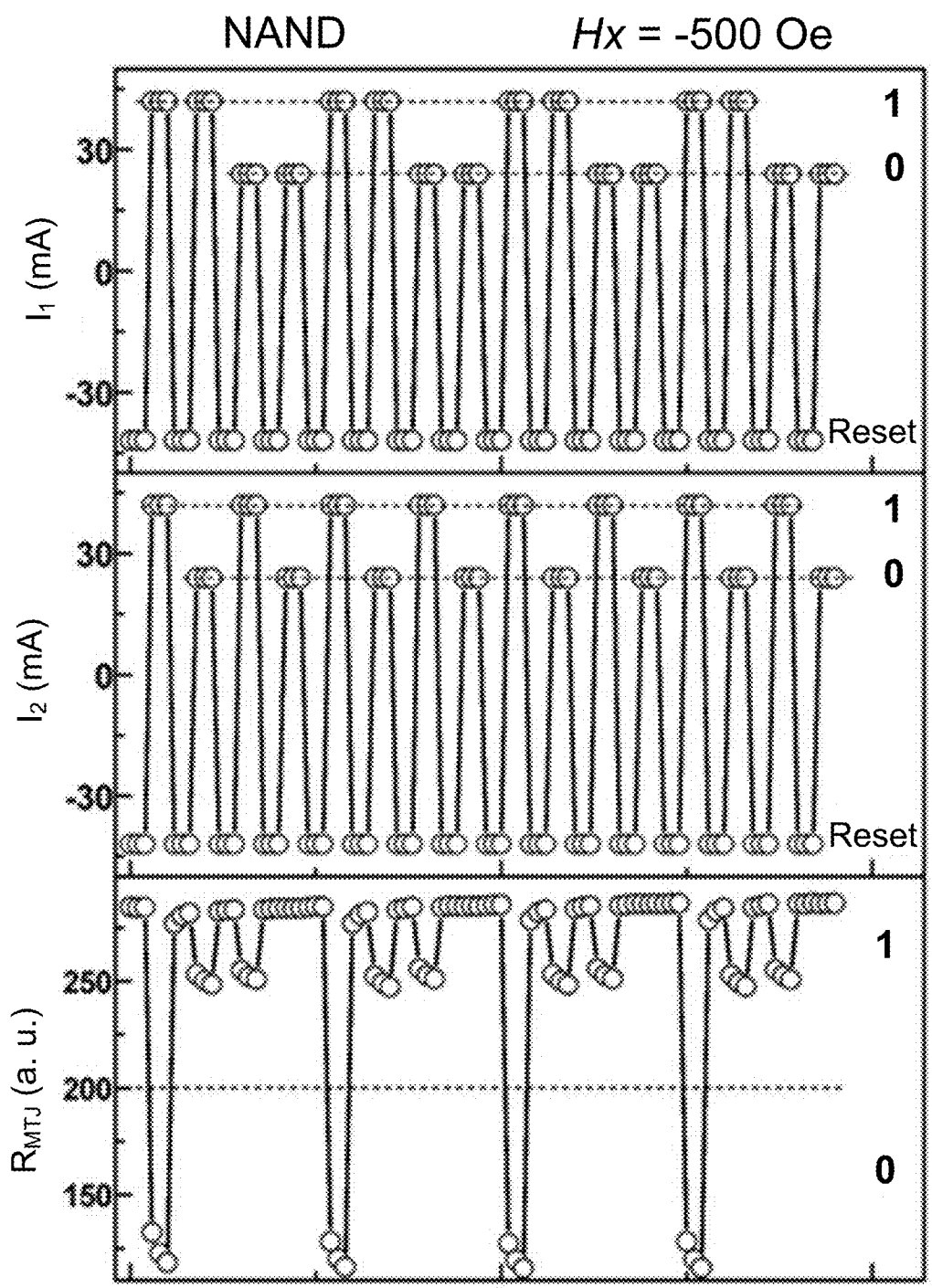

FIG. 4D shows a signal graph of the spin logic device 300 of FIG. 3 that is configured as a "NAND" gate to perform a logical "NAND" operation. A truth table of the "NAND" gate is also shown in the below Table 4. It can be seen from FIG. 4D and Table 4 that the logical "NAND" operation of the spin logic device 300 is substantially similar to the logical "AND" operation shown in FIG. 4A and Table 1 except that in the "NAND" operation shown in FIG. 4D, the initial state of the magnetic tunnel junction 310 is set to the anti-parallel state, and the Oersted field is set in an opposite direction. Therefore, detailed operation steps will not be repeated herein.

TABLE 4

Truth table of logical "NAND"

| Input Current $I_1$ | Input Current $I_2$ | Output |
|---|---|---|
| 1 | 1 | 0 |
| 1 | 0 | 1 |
| 0 | 1 | 1 |
| 0 | 0 | 1 |

Figure 4E:
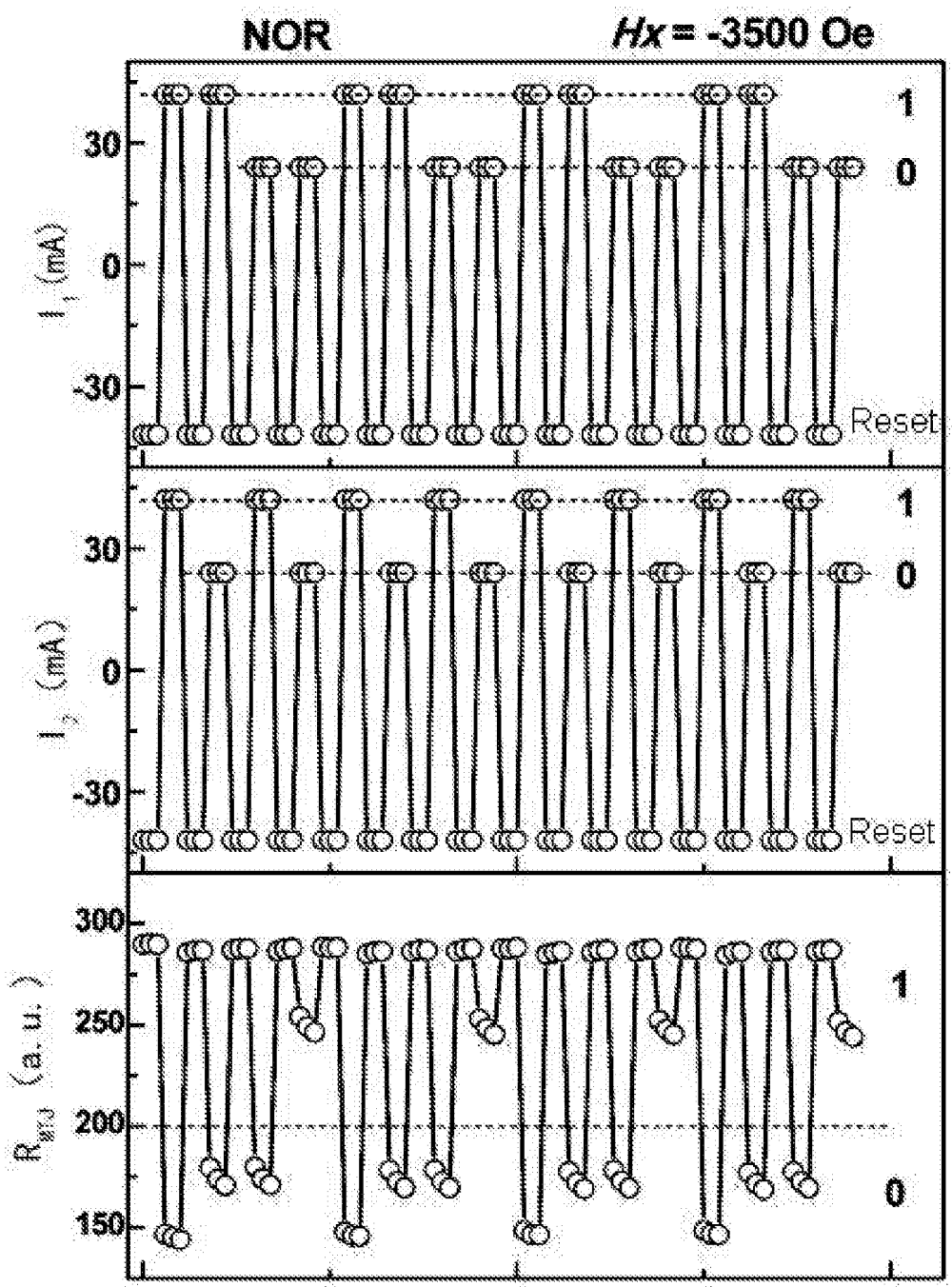

FIG. 4E shows a signal graph of the spin logic device 300 of FIG. 3 that is configured as a "NOR" gate to perform a logical "NOR" operation. A truth table of the "NOR" gate is also shown in the below Table 5. It can be seen from FIG. 4E and Table 5 that the logical "NOR" operation of the spin logic device 300 is substantially similar to the logical "OR" operation shown in FIG. 4B and Table 2 except that in the "NOR" operation shown in FIG. 4E, the initial state of the magnetic tunnel junction 310 is set to the anti-parallel state, and the Oersted field is set in an opposite direction Therefore, detailed operation steps will not be repeated herein.

TABLE 5

Truth table of logical "NOR"

| Input Current $I_1$ | Input Current $I_2$ | Output |
|---|---|---|
| 1 | 1 | 0 |
| 1 | 0 | 0 |
| 0 | 1 | 0 |
| 0 | 0 | 1 |

As described above, by setting the magnitude of the first input current and the second input current $I_2$ and the magnitude and direction of the third input current $I_3$, the spin logic device 300 may be configured to act as an AND gate, a NOT gate, an OR gate, a NAND gate or a NOR gate. Therefore, these embodiments of the present invention have provided a programmable logic gate device and a method of operating it. As compared to the conventional semiconductor logic devices that are non-programmable, the logic device of the present invention may provide more flexibility in operation.

Figure 5:
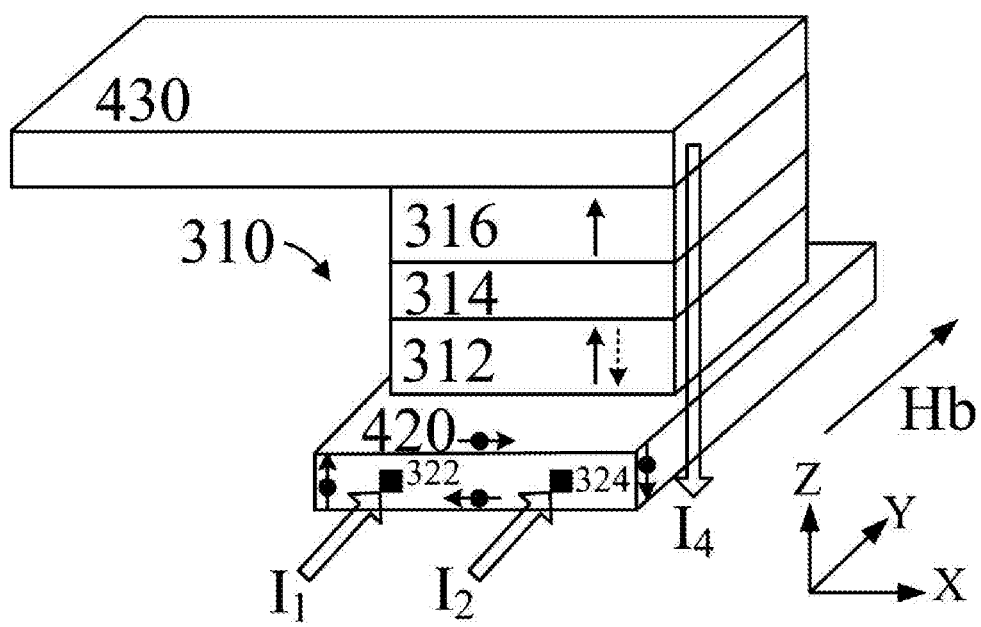
FIG. 5 is an illustration of a spin logic device in accordance with another exemplary embodiment of the present invention.

FIG. 5 is an illustration of a spin logic device 400 in accordance with another exemplary embodiment of the present invention. As shown in FIG. 5, components of the spin logic device 400 identical to those of the spin logic device 300 shown in FIG. 3 are denoted with the same reference numerals and detailed description thereof will be omitted herein.

Referring to FIG. 5, the SHE layer 320 (FIG. 3) is replaced by a SHE biasing layer 420. As the name implies, the SHE biasing layer 420 can not only exhibit the Spin Hall effect, but also provide a magnetic biasing field to bias the magnetization of the free magnetic layer 312. To this end, the SHE biasing layer 420 needs to be made of materials that have the Spin Hall effect and can provide the magnetic biasing field. Examples of such materials for the SHE biasing layer 420 include, but not limited to anti-ferromagnetic materials having the Spin Hall effect such as PtMn, IrMn, and AuMn. The SHE biasing layer 420 may be formed by a magnetron sputtering process and/or processed by a magnetic annealing process such that it is enabled to provide a magnetic biasing field Hb in a direction parallel with the direction of the first and second input currents $I_1$, $I_2$ or the combination thereof, which is the Y-axis direction in the example shown in FIG. 5. With the biasing field Hb provided by the SHE biasing layer 420 and the spin flow generated by the input currents $I_1$, $I_2$, the magnetization of the free magnetic layer 312 may be reversed to implement a logic operation. The basic principle to reverse the magnetization of the free magnetic layer 312 in the spin logic device 400 is similar to that described above with reference to the spin logic device 300 shown in FIG. 3 and a detailed description thereof will be omitted herein.

Since the SHE biasing layer 420 provides the magnetic biasing field Hb, the spin logic device 400 does not need the current wiring 330 (FIG. 3) to induce the Oersted field as in the spin logic device 300 shown in FIG. 3. In the embodiment shown in FIG. 5, instead, the spin logic device 400 includes a read wiring 430 in connection with the magnetic tunnel junction 310 to apply the read current $I_4$ thereon. It is to be understood that since the read wiring 430 is not required to induce the Oersted field, it may be oriented in any direction, including but not limited to the direction shown in FIG. 5. With the read wiring 430 and the SHE biasing layer 420 provided respectively on the upper and lower sides of the magnetic tunnel junction 310, the read current $I_4$ may be applied passing perpendicularly through the magnetic tunnel junction 310 to thereby read out the logical state of the magnetic tunnel junction 310.

As discussed above with respect to the spin logic device 300 shown in FIG. 3, the current wiring 330 can induce a variable Oersted field by adjusting the current applied thereon to assist in reversing the magnetization of the free magnetic layer 312. In contrast, the spin logic device 400 shown in FIG. 5 can operate with only a fixed biasing field Hb provided by the SHE biasing layer 420, and hence it has less flexibility in operation. Specifically, the spin logic device 300 of FIG. 3 can be configured as an AND gate, a NOT gate, an OR gate, a NAND gate and a NOR gate by adjusting the magnitude and direction of the Oersted field Hx as discussed above. The spin logic device 400 of FIG. 5, however, may be configured as an AND gate, an OR gate and an OR gate, or as an NOT gate and a NAND gate, depending on the magnitude and direction of the fixed biasing field Hb provided by the SHE biasing layer 420.

Figure 6:
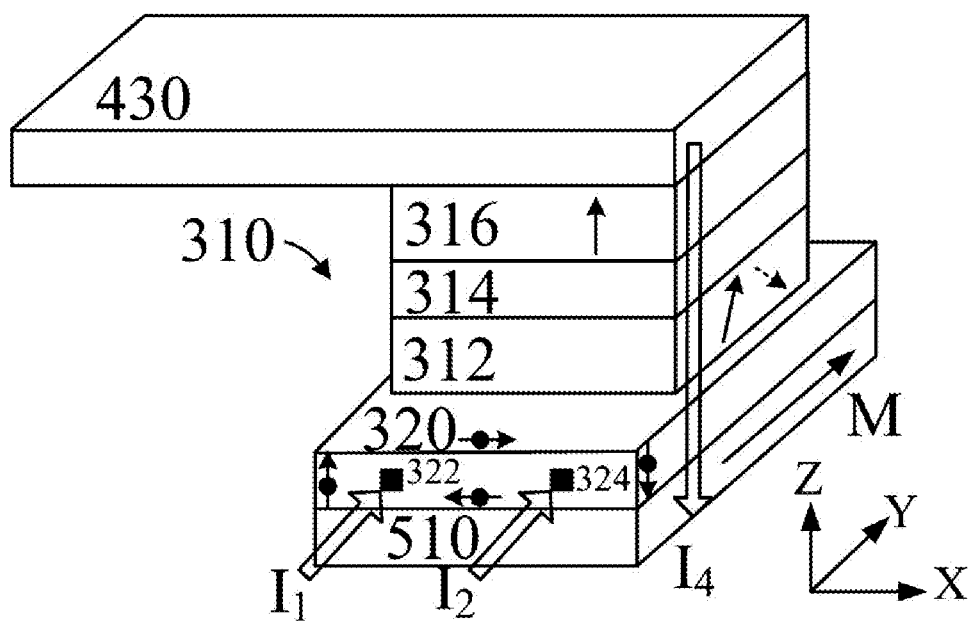
FIG. 6 is an illustration of a spin logic device in accordance with another exemplary embodiment of the present invention.

FIG. 6 is an illustration of a spin logic device 500 in accordance with another exemplary embodiment of the present invention. As shown in FIG. 6, components of the spin logic device 500 identical to those of the spin logic device 300 shown in FIG. 3 and the spin logic device 400 shown in FIG. 5 are denoted with the same reference numerals and detailed description thereof will be omitted herein.

Referring to FIG. 6, the spin logic device 500 may include a magnetic tunnel junction 310 provided between a SHE layer 320 and a read wiring 430, and the magnetic tunnel junction 310 may further include a free magnetic layer 312, a barrier layer 314 and a reference magnetic layer 316 formed in this order on the SHE layer 320. The spin logic device 500 may further include a magnetic biasing layer 510 formed on a side of the SHE layer 320 opposite to the free magnetic layer 312. The magnetic biasing layer 510 may be formed of a ferromagnetic material, examples of which may include, but not limited to Co, Fe, Ni and alloys including one or more of them. The magnetic biasing layer 510 may have in-plane magnetization M oriented in a direction parallel with the direction of the input currents $I_1$ and $I_2$, namely the Y-axis direction in the example shown in FIG. 6. In some embodiments, the magnetic biasing layer 510 may have a thickness in a range from 1 nm to 50 nm, preferably from 2 nm to 20 nm. In some other embodiments, the spin logic device 500 may further include an anti-ferromagnetic pinning layer (not shown in FIG. 6) on a side of the magnetic biasing layer 510 opposite to the SHE layer 320 to pin/fix the magnetization M of the magnetic biasing layer 510.

In the spin logic device 500, the free magnetic layer 312 and the magnetic biasing layer 510 may be coupled with each other through exchange coupling induced by the SHE layer 320, which may be a ferromagnetic coupling (parallel coupling) or an anti-ferromagnetic coupling (anti-parallel coupling). In order to induce the exchange coupling, the SHE layer 320 may have a thickness in a range from 0.4 nm to 20 nm, preferably from 0.8 nm to 6 nm. With the exchange coupling, the magnetization of the free magnetic layer 312 may be rotated from the vertical direction toward the magnetization direction of the magnetic biasing layer 510 (or its opposite direction in the case of anti-parallel exchange coupling), as shown in FIG. 6. Therefore, the magnetization of the free magnetic layer 312 has not only a vertical component, but also a horizontal component, and the horizontal component may be in a direction parallel or anti-parallel with the direction of the input currents and $I_2$. The horizontal component of the magnetization of the free magnetic layer 312 is equivalent to the Oersted field Hx and the magnetic biasing field Hb discussed above, and it may cooperate with the input currents and $I_2$ to reverse the magnetization M of the free magnetic layer 312. It would be appreciated that the operation of the spin logic device 500 is similar to that of the spin logic device 400 as discussed above and a detailed description will be omitted herein.

Figure 7:
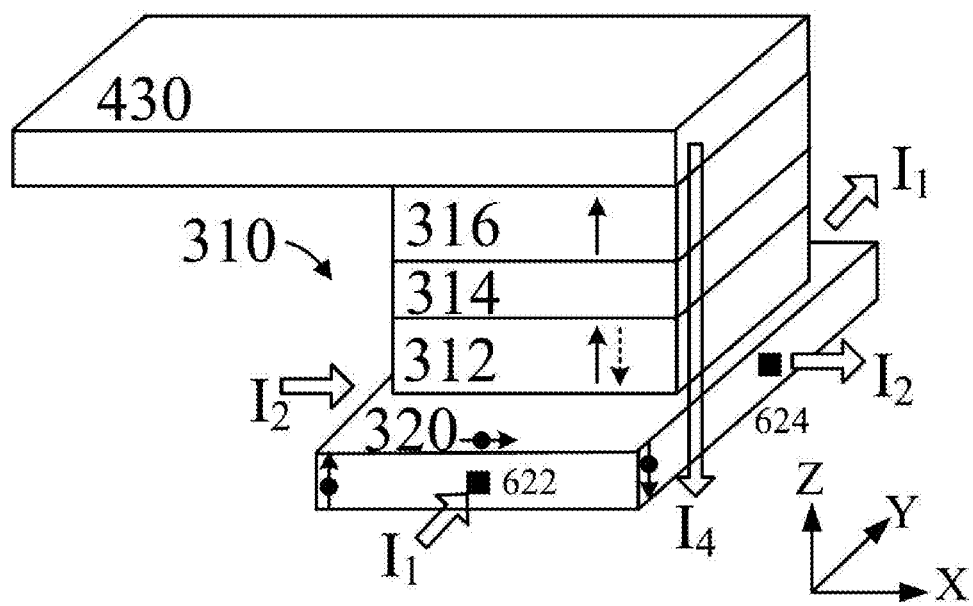
FIG. 7 is an illustration of a spin logic device in accordance with another exemplary embodiment of the present invention.

FIG. 7 is an illustration of a spin logic device 600 in accordance with another exemplary embodiment of the present invention. As shown in FIG. 7, components of the spin logic device 600 identical to those in the foregoing embodiments are denoted with the same reference numerals and detailed description thereof will be omitted herein.

Referring to FIG. 7, the spin logic device 600 may include a magnetic tunnel junction 310 formed between a SHE layer 320 and a read wiring 430, and the magnetic tunnel junction 310 may further include a free magnetic layer 312, a barrier layer 314 and a reference magnetic layer 316 formed in this order on the SHE layer 320. Unlike the foregoing embodiments, in the embodiment shown in FIG. 7, the in-plane input currents and $I_2$ are applied to the SHE layer 320 in directions perpendicular to each other. Specifically, as shown in FIG. 7, the SHE layer 320 may be provided with terminals 622 on two sides along the Y-axis direction to receive the first input current and terminals 624 on two sides along the X-axis direction to receive the second input current $I_2$.

When both the first and second input currents and $I_2$ flow through the SHE layer 320, one of them can provide the spin torque as described above with reference to FIG. 2, while the other can provide an equivalent magnetic field by the Oersted effect or the Rashba effect to assist in reversing the magnetization of the free magnetic layer 312. As known, the Oersted field induced by the Oersted effect may be determined using the right-hand screw rule. The Rashba effect refers to an electric field generated at the interface between the SHE layer 320 and the free magnetic layer 312 due to a difference of work functions of the SHE layer 320 and the free layer 312, and the electric field is in a direction perpendicular to the interface. When a current flows along the interface, an equivalent magnetic field will occur in a direction of cross-multiplication of the electric field vector and the current vector. This equivalent magnetic field is also referred to as Rashba equivalent field. When the first input current and the second input current $I_2$ are perpendicular to each other, the Oersted field or the Rashba equivalent field generated by one of the currents $I_1$, $I_2$ may be in a direction parallel to the other current. Therefore, the spin torque generated from one of the currents $I_2$ and the Oersted or Rashba field generated by the other current may cooperate to reverse the magnetization of the free magnetic layer 312.

It would be understood that the first input current and the second input current $I_2$ each actually produce both the spin torque and the Oersted or Rashba equivalent field, but two spin torques or two equivalent fields cannot reverse magnetization of the free magnetic layer 312. In order to reverse the magnetization of the free magnetic layer 312, the spin torque generated by one current and the equivalent field generated by the other current are needed.

Also, the spin logic device 600 can perform logical AND, NOT, NAND, OR and NOR operations, and such operations are similar to those discussed above with reference to the spin logic device 300 shown in FIG. 3, so a detailed description thereof is omitted herein.

Figure 8:
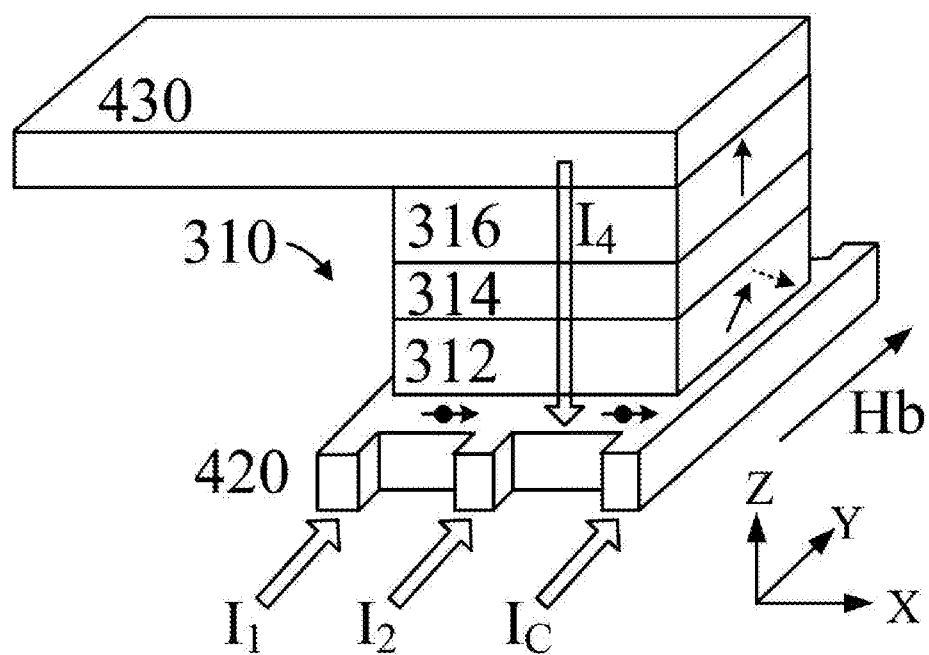
FIG. 8 is an illustration of a spin logic device in accordance with another exemplary embodiment of the present invention.

FIG. 8 is an illustration of a spin logic device 700 in accordance with another exemplary embodiment of the present invention. As shown in FIG. 8, the spin logic device 700 has a structure substantially similar to that of the spin logic device 400 shown in FIG. 5, and the description below will focus only on the difference therebetween.

Referring to FIG. 8, the spin logic device 700 includes a magnetic tunnel junction 310 disposed between a SHE biasing layer 420 and a read wiring 430. The magnetic tunnel junction 310 includes a free magnetic layer 312, a barrier layer 314 and a reference magnetic layer 316 formed in this order on the SHE biasing layer 420. Unlike the spin logic device 400, the SHE biasing layer 420 in the spin logic device 700 is configured to receive a fifth control current $I_C$ in addition to the first and second input currents and $I_2$. In the embodiment shown in FIG. 8, the first, second and fifth current $I_1$, $I_2$ and $I_C$ are all in a direction parallel with the biasing field Hb, that is, parallel with the Y-axis direction. The fifth control current $I_C$ may serve to control the operation mode of the spin logic device 700 as described in detail below with reference to FIGS. 9A-9B.

Figure 9A:
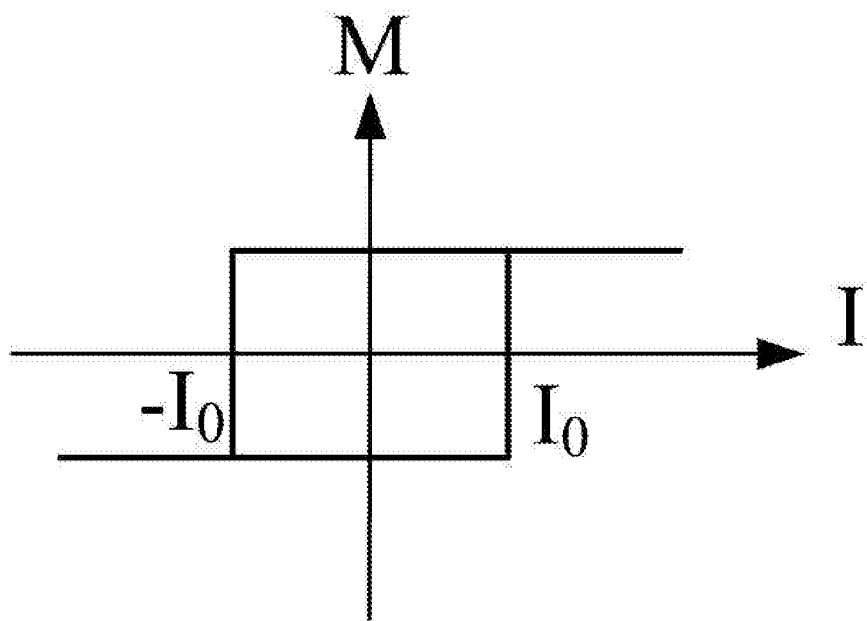
FIGS. 9A and 9B are schematic diagrams showing dependence of magnetization of the free magnetic layer on the current applied to the Spin Hall effect layer in the spin logic device of FIG. 8.
Figure 9B:
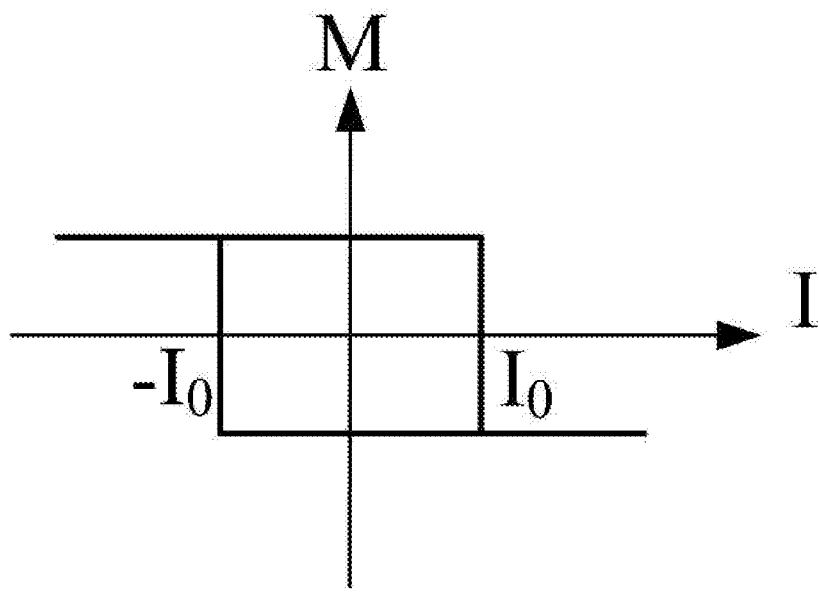

FIGS. 9A and 9B are schematic diagrams showing dependence of magnetization of the free magnetic layer on the current applied to the Spin Hall effect layer in the spin logic device 700 of FIG. 8, where FIG. 9A shows a case in which the biasing field Hb is oriented in a first direction (for example, the +Y direction), while FIG. 9B shows a case in which the biasing field Hb is oriented in a second direction opposite to the first direction (for example, the −Y direction). As seen from FIGS. 9A and 9B, when the current flowing through the SHE biasing layer 420 (which is the sum of the first, second and fifth currents $I_1$, $I_2$ and $I_C$ in the embodiment shown in FIG. 8) is large enough, for example, larger than a threshold $I_0$, it can, in cooperation with the biasing field Hb, switch the magnetization of the free magnetic layer 312 to a predetermined direction depending on the direction of the current and the direction of the biasing field Hb. Those skilled in the art would easily understand that the magnetization direction of the free magnetic layer 312 may be determined by the direction of the current and the direction of the biasing field Hb.

The operation of the spin logic device 700 will be described below with reference to FIGS. 8 and 9A. At first, the spin logic device 700 may be initialized or reset to a predetermined initial state. In an example, the first and second input currents and $I_2$ each may be set to $-I_0/2$, and the fifth control current $I_C$ may be set to $-I_0/2-A$ such that the sum of the first, second and fifth currents $I_2$ and $I_C$ is $-I_0-A$. The A may have a small value larger than zero, e.g., $0<A<I_0/2$. With these currents and the biasing field Hb, the magnetization of the free magnetic layer 312 may be reversed to a predetermined direction and the magnetic tunnel junction 310 may be set to a predetermined initial state, for example, an initial parallel state.

In logical operations, the fifth current $I_C$ may be set to $I_0/2+A$, and the first and second currents $I_1$, $I_2$ may be set to zero corresponding to logical "0" or $I_0/2$ corresponding to logical "1". If both the first and second currents $I_1$, $I_2$ are zero corresponding to logical "0", the overall current flowing through the SHE biasing layer 420 is $I_0/2+\Delta$ ($0<\Delta<I_0/2$), which is less than the threshold current $I_0$ and thus the magnetization of the free magnetic layer 312 cannot be reversed. As a result, the magnetic tunnel junction 310 maintains the initial parallel state. With the read current $I_4$ passing through the magnetic tunnel junction 310, it may be determined that the magnetic tunnel junction 310 has a relatively low resistance, which corresponds to logical "0".

When any one of the first and second currents $I_1$, $I_2$ is zero corresponding to logical "0" and the other is $I_0/2$ corresponding to logical "1", the overall current flowing through the SHE biasing layer 420 is $I_0+\Delta$ ($0<\Delta<I_0/2$), which is larger than the threshold current $I_0$ and thus the magnetization of the free magnetic layer 312 will be reversed. As a result, the magnetic tunnel junction 310 switches from the initial parallel state to the anti-parallel state. With the read current $I_4$ passing through the magnetic tunnel junction 310, it may be determined that the magnetic tunnel junction 310 has a relatively high resistance, which corresponds to logical "1".

If both the first and second currents $I_1$, $I_2$ are $I_0/2$ corresponding to logical "1", the overall current flowing through the SHE biasing layer 420 is $3I_0/2+\Delta$ ($0<\Delta<I_0/2$), which is larger than the threshold current $I_0$. Also, the magnetic tunnel junction 310 switches to the anti-parallel high-resistance state that corresponds to logical "1".

As described above, the spin logic device 700 has accomplished the logic OR operation.

It should be noted that when the magnetization of the free magnetic layer 312 is reversed, the initial state of the magnetic tunnel junction 310 is also changed, which will affect subsequent logic operations of the spin logic device 700. To avoid this issue, a reset operation described above may be carried out on the spin logic device 700 after and/or before each logic operation to reset the initial state. In some other embodiments, it is also possible to carry out the reset operation only when the magnetization of the free magnetic layer 312 is reversed.

The above has described the operation of the spin logic device 700 as a logic OR gate with the fifth control current $I_C$ being set to a predetermined value ($I_0/2+\Delta$ in this example). When the fifth control current $I_C$ is set to another predetermined value, the spin logic device 700 may also operate as a logic AND gate. The operation of the spin logic device 700 as a logic AND gate will be described below with reference to FIGS. 8 and 9A.

In an example, the fifth control current $I_C$ may be set to have a value A that may be a small value less than $I_0/2$ but larger than zero ($0<\Delta<I_0/2$). Other aspects may be the same as the spin logic device 700 acting as the logic OR gate as described above. Herein, when the first current is set to zero corresponding to logical "0" and the second current $I_2$ is also set to zero corresponding to logical "0", the overall current flowing through the SHE biasing layer 420 is $\Delta$ ($0<\Delta<I_0/2$), which is less than the threshold current $I_0$ and thus the magnetization of the free magnetic layer 312 cannot be reversed. As a result, the magnetic tunnel junction 310 maintains the initial parallel state. With the read current $I_4$ passing through the magnetic tunnel junction 310, it may be determined that the magnetic tunnel junction 310 has a relatively low resistance, which corresponds to logical "0".

When any one of the first and second currents $I_1$, $I_2$ is zero corresponding to logical "0" while the other is $I_0/2$ corresponding to logical "1", the overall current flowing through the SHE biasing layer 420 is $I_0/2+\Delta$ ($0<\Delta<I_0/2$), which is still less than the threshold current $I_0$. In this case, the output of the spin logic device 700 is still logical "0".

When both of the first and second currents and $I_2$ are $I_0/2$ corresponding to logical "1", the overall current flowing through the SHE biasing layer 420 becomes $I_0+\Delta$ ($0<\Delta<I_0/2$), which is larger than the threshold current $I_0$. In this case, the magnetization of the free magnetic layer 312 may be reversed, and the magnetic tunnel junction 310 switches from the initial parallel state to the anti-parallel state. Therefore, the output of the spin logic device 700 becomes logical "1".

As described above, the spin logic device 700 has accomplished the logic AND operation.

On the other hand, referring to FIG. 8, if the spin logic device 700 is manufactured such that the biasing field Hb is oriented in an opposite direction (the −Y direction in this example), or the positive direction of the currents $I_2$ and $I_C$ is defined as the opposite direction, the dependence of the magnetization of the free magnetic layer 312 on the current flowing through the SHE biasing layer 420 is the case as shown in FIG. 9B. The operation of such a spin logic device 700 will be described below with reference to FIGS. 8 and 9B.

At first, the spin logic device 700 may be initialized or reset to a predetermined initial state. In an example, the first and second input currents and $I_2$ each may be set to $-I_0/2$, and the fifth control current $I_C$ may be set to $-I_0/2-A$ such that the sum of the first, second and fifth currents $I_2$ and $I_C$ is $-3I_0/2-A$. The A may have a small value larger than zero, e.g., $0<\Delta<I_0/2$. With these currents and the biasing field Hb, the magnetization of the free magnetic layer 312 may be reversed to a predetermined direction and the magnetic tunnel junction 310 may be set to a predetermined initial state, for example, an initial anti-parallel state.

In the logic operations, the fifth current $I_C$ may be set to $I_0/2+\Delta$, and the first and second currents and $I_2$ each may be set to zero corresponding to logical "0" or $I_0/2$ corresponding to logical "1". If both the first current and the second current $I_2$ are zero corresponding to logical "0", the overall current flowing through the SHE biasing layer 420 is $I_0/2+\Delta$, which is less than the threshold current $I_0$ such that the magnetization of the free magnetic layer 312 cannot be reversed and the magnetic tunnel junction 310 maintains its initial anti-parallel state. As a result, the spin logic device 700 outputs logical "1".

If any one of the first and second currents $I_1$, $I_2$ is zero corresponding to logical "0" and the other is $I_0/2$ corresponding to logical "1", the overall current flowing through the SHE biasing layer 420 is $I_0+\Delta$, which is larger than the threshold current $I_0$ such that the magnetization of the free magnetic layer 312 may be reversed and the magnetic tunnel junction 310 switches into the parallel state. As a result, the spin logic device 700 outputs logical "0".

When both of the first and second currents and $I_2$ are $I_0/2$ corresponding to logical "1", the overall current flowing through the SHE biasing layer 420 is $3I_0/2+\Delta$, which is larger than the threshold current $I_0$ such that the magnetization of the free magnetic layer 312 can be reversed, and the magnetic tunnel junction 310 switches to the parallel state. As a result, the spin logic device 700 outputs logical "0".

As described above, the spin logic device 700 has accomplished the logic NOR operation.

The above has described the operation of the spin logic device 700 as the logic NOR gate with the fifth control current $I_C$ being set to a predetermined value ($I_0/2+\Delta$ in this example). When the fifth control current $I_C$ is set to another predetermined value, the spin logic device 700 may also operate as a logic NAND gate. The operation of the spin logic device 700 as the logic NAND gate will be described below with reference to FIGS. 8 and 9B.

In an example, the fifth control current $I_C$ may be set to have a value A that may be a small value less than $I_0/2$ but larger than zero ($0<\Delta<I_0/2$). Other aspects may be the same as the spin logic device 700 acting as the logic NOR gate as described above. Herein, when the first current is set to zero corresponding to logical "0" and the second current $I_2$ is also set to zero corresponding to logical "0", the overall current flowing through the SHE biasing layer 420 is $\Delta$ ($0<\Delta<I_0/2$), which is less than the threshold current $I_0$ and thus the magnetization of the free magnetic layer 312 cannot be reversed. As a result, the magnetic tunnel junction 310 maintains the initial anti-parallel state. With the read current $I_4$ passing through the magnetic tunnel junction 310, it may be determined that the magnetic tunnel junction 310 has a relatively high resistance, which corresponds to logical "1".

If any one of the first and second currents $I_1$, $I_2$ is set to zero corresponding to logical "0" and the other is set to $I_0/2$ corresponding to logical "1", the overall current flowing through the SHE biasing layer 420 is $I_0/2+\Delta$, which is still less than the threshold current $I_0$. So, the output of the spin logic device 700 is still logical "1".

When the first and second currents and $I_2$ both are set to $I_0/2$ corresponding to logical "1", the overall current flowing through the SHE biasing layer 420 is $I_0+\Delta$, which is larger than the threshold current $I_0$. Then, the magnetization of the free magnetic layer 312 is reversed, and the magnetic tunnel junction 310 enters into the parallel state corresponding to logical "0".

As described above, the spin logic device 700 has accomplished the logic NAND operation.

In some embodiments, the spin logic device 700 may also be configured to operate as a logic NOT gate by setting the fifth current $I_C$ to $I_0/2+\Delta$ and setting the second current $I_2$ to zero. Specifically, when the first input current is zero corresponding to logical "0", the magnetic tunnel junction 310 maintains its initial anti-parallel state and outputs logical "1"; when the first input current $I_1$ is set to $I_0/2$ corresponding to logical "1", the overall current flowing through the SHE biasing layer 420 is $I_0+\Delta$ that is larger than the threshold current $I_0$, and the magnetization of the free magnetic layer 312 is reversed so that the magnetic tunnel junction 310 becomes the parallel state and outputs logical "0". As such, the spin logic device 700 has accomplished the logic NOT operation.

In the foregoing embodiments, the spin logic device 700 may be configured to operate as a logic OR gate and a logic AND gate when it has an initial parallel state, and switching between the logic OR gate and the logic AND gate may be accomplished by adjusting the fifth control current $I_C$. When the spin logic device 700 has an initial anti-parallel state, it can be configured to operate as a logic NOR gate and a logic NAND gate, and switching between the two gates may be accomplished by adjusting the fifth control current, or the spin logic device 700 may be configured to operate as a logic NOT gate. It is to be understood that, however, the present invention is not limited to such embodiments. For example, if the high resistance state (the anti-parallel state) of the magnetic tunnel junction is defined as logical "0" and the low resistance state (the parallel state) is defined as logical "1", the spin logic device 700 may operate as the logic OR gate and the logic AND gate with an initial anti-parallel state, and operate as the logic NOR gate and the NAND gate with an initial parallel state. All such variations fall within the scope of the present invention.

Figure 10:
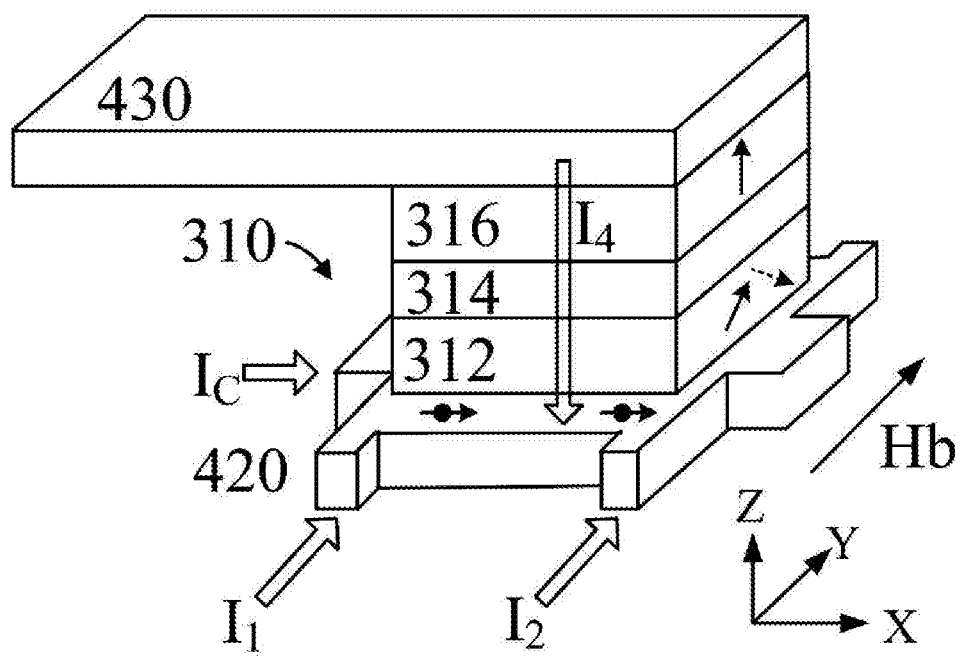
FIG. 10 is an illustration of a spin logic device in accordance with another exemplary embodiment of the present invention.

FIG. 10 shows a spin logic device 800 in accordance with another embodiment of the present invention. The spin logic device 800 is substantially identical to the spin logic device 700 shown in FIG. 8 except for the fifth control current $I_C$ applied to the SHE biasing layer 420. Therefore, repetitive description of the same or similar elements will be omitted herein.

As shown in FIG. 10, the SHE biasing layer 420 of the spin logic device 800 also receives the first, second and fifth in-plane currents $I_1$, $I_2$ and $I_C$. However, unlike the embodiment shown in FIG. 8, in FIG. 10 the fifth current $I_C$ is in a direction perpendicular to the first and second currents $I_1$ and $I_2$.

Figure 11A:
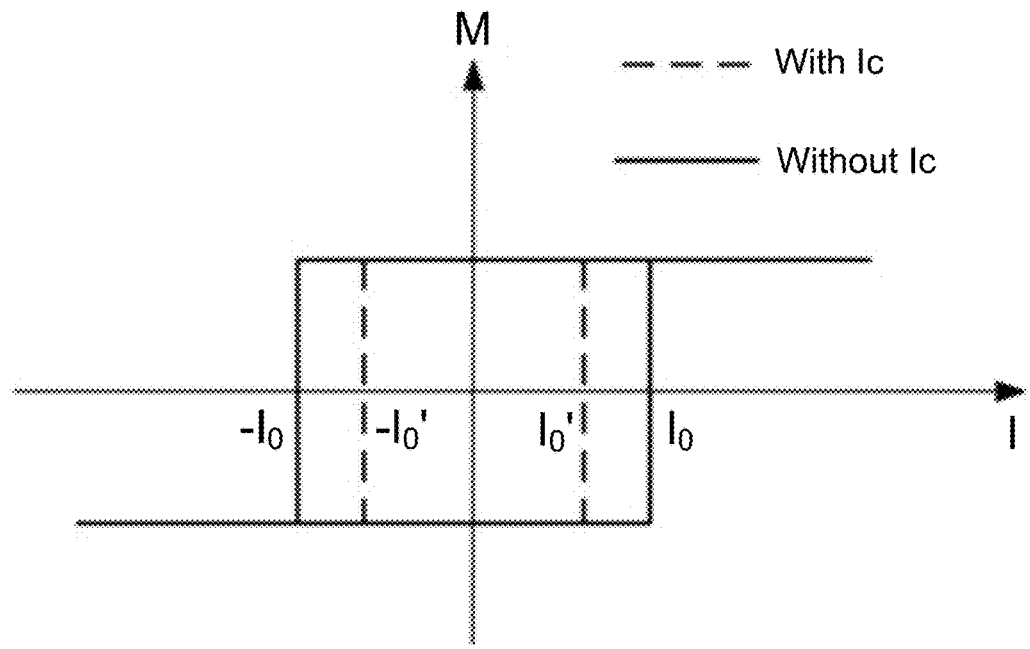
FIGS. 11A and 11B are schematic diagrams showing dependence of magnetization of the free magnetic layer on the current applied to the Spin Hall effect layer in the spin logic device of FIG. 8.
Figure 11B:
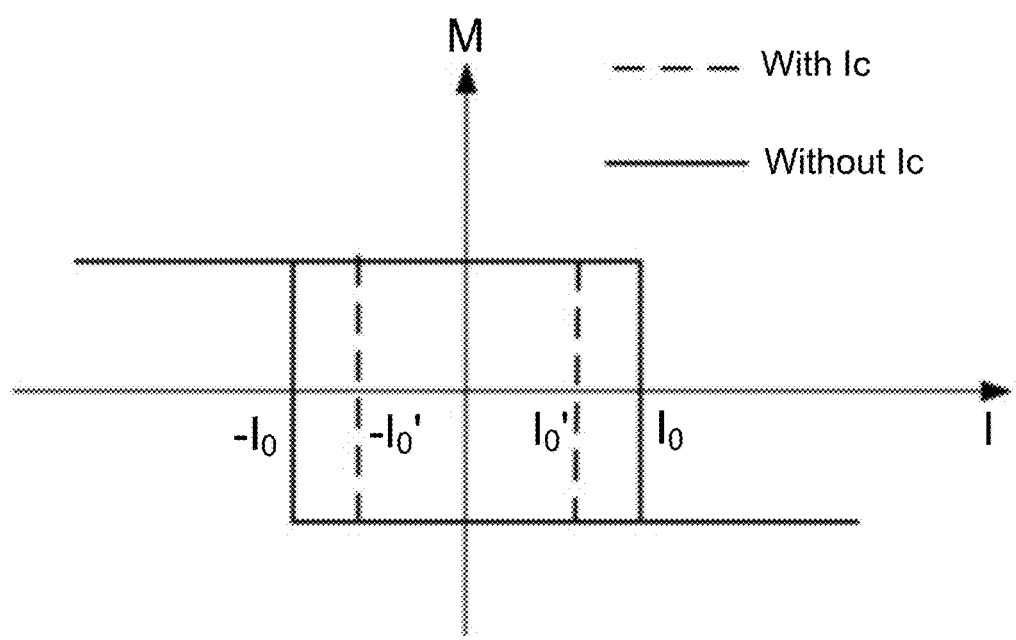

FIGS. 11A and 11B are graphs showing dependence of the magnetization M of the free magnetic layer 312 on the current I ($I=I_1+I_2$) applied to the SHE biasing layer 420 in the spin logic device 800 shown in FIG. 10. The current I is a combination of the input currents $I_1$ and $I_2$ applied to the SHE biasing layer 420. FIG. 11A corresponds to a case in which the biasing field Hb is parallel to the current I, and FIG. 11B corresponds to a case in which the biasing field Hb is anti-parallel to the current I. The inventor found out that even when the fifth current $I_C$ is applied in the direction perpendicular to the reversing current I (which is the combination of the first and second input currents and $I_2$), it may also modify the threshold current $I_0$ for reversing magnetization of the free magnetic layer 312. Specifically, as shown in FIGS. 11A and 11B, when the fifth current $I_C$ is not applied, the threshold current for reversing magnetization of the free magnetic layer 312 is $I_0$; and when the fifth current $I_C$ is applied, the threshold current for reversing magnetization of the free magnetic layer 312 is $I_0'$, which is less than $I_0$.

The operation of the spin logic device 800 will be described below with reference to FIGS. 10 and 11A. The initial state of the spin logic device 800 may be set to the parallel state. The first and second currents and $I_2$ that function as logical inputs, may be set as zero corresponding to logical "0" or as $I_a$ corresponding to logical "1", wherein $I_0' < I_a < I_0$, and $I_0/2 < I_a$. In a first mode, the fifth current $I_C$ may be zero, that is, no fifth current $I_C$ is applied, and the threshold current for reversing magnetization of the free magnetic layer 312 is $I_0$ as shown in FIG. 11A. When the first and second currents $I_1$ and $I_2$ each are zero corresponding to logical "0", the magnetization of the free magnetic layer 312 is not reversed, and the read current $I_4$ reads out logical "0". When one of the first and second currents $I_1$ and $I_2$ is zero corresponding to logical "0" while the other is $I_a$ corresponding to logical "1", the total current flowing through the SHE biasing layer 420 in the direction identical to the bias magnetic field Hb, i.e., the sum of the currents $I_1$ and $I_2$, is $I_a$, which is less than the threshold current $I_0$. Therefore, the magnetization of the free magnetic layer 312 cannot be reversed and the read current $I_4$ still reads out logical "0". When both the first and second currents $I_1$ and $I_2$ are $I_a$ corresponding to logical "1", the total current flowing through the SHE biasing layer 420 in the direction identical to the bias magnetic field Hb is $2I_a$, which is larger than the threshold current $I_0$. Therefore, the magnetization of the free magnetic layer 312 is reversed and thus the read current $I_4$ reads out logical "1". In this way, the spin logic device 800 has accomplished the logic AND operation.

When the control current $I_C$ of a predetermined value is applied as shown in FIG. 10, the threshold current for reversing the free magnetic layer 312 becomes $I_0'$, which is less than $I_0$. In this case, if the first and second currents and $I_2$ each are zero corresponding to logical "0", the magnetization of the free magnetic layer 312 is not reversed, and the read current $I_4$ reads out logical "0". When any one of the first and second currents $I_1$ and $I_2$ is $I_a$ corresponding to logical "1" and the other is zero corresponding to logical "0", the total current flowing through the SHE biasing layer 420 in the direction identical to the bias magnetic field Hb is $I_a$, which is larger than the threshold current $I_0'$. Therefore, the magnetization of the free magnetic layer 312 is reversed, and the read current $I_4$ reads out logical "1". When both the first and second currents and $I_2$ are $I_a$ corresponding to logical "1", the total current flowing through the SHE biasing layer 420 in the direction identical to the bias magnetic field Hb is $2I_a$, which is larger than the threshold current $I_0'$. Therefore, the magnetization of the free magnetic layer 312 is reversed, and the read current $I_4$ reads out logical "1". In this way, the spin logic device 800 has accomplished the logic OR operation.

As can be seen, similar to the embodiment discussed above with reference to FIGS. 8 and 9A, the spin logic device 800 can be configured to operate as the logic OR gate and the logic AND gate, and switching between the logic OR and AND gates can be achieved by adjusting the fifth control current $I_C$.

Also, the spin logic device 800 can operate as the NAND gate, the NOR gate and the NOT gate when it is configured as shown in FIG. 11B. The operations of the spin logic device 800 as the NAND gate, the NOR gate and the NOT gate are similar to those described above with reference to FIGS. 8 and 9B, a detailed description thereof will be omitted herein.

Embodiments in which the SHE biasing layer 420 receives two in-plane currents such as the input currents $I_1$ and $I_2$ or three in-plane currents such as the input currents $I_1$, $I_2$ and the control current $I_C$ have been described above, however, it is to be understood that the present invention is not limited to these embodiments. The principle of the present invention is also applicable to cases where the SHE biasing layer receives four or more in-plane currents. For example, the SHE biasing layer may receive more logic input currents and/or more control currents.

In the above-mentioned embodiments, the spin logic device may be configured to operate as different logic gates, and switching between the different logic gates may be accomplished easily by adjusting the control current applied to the spin logic device. So, the spin logic device of the embodiments may be conveniently programmed, and a hardware circuit including one or more such spin logic devices may be flexibly configured.

Figure 12:
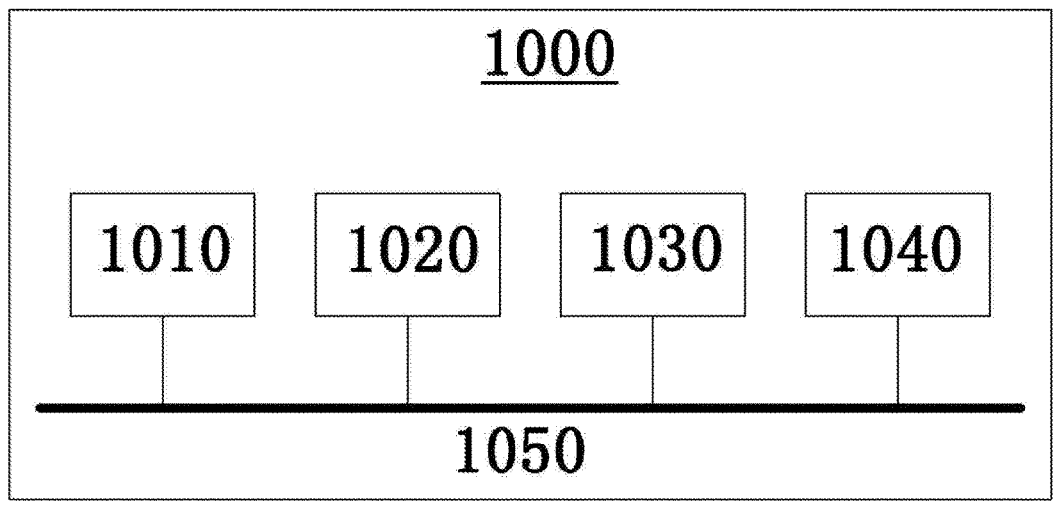
FIG. 12 illustrates a block diagram of an electronic equipment in accordance with an exemplary embodiment of the present invention.

FIG. 12 shows an electronic equipment 1000 according to an embodiment of the present invention in which any of the spin logic devices described in the above embodiments may be utilized. As shown in FIG. 12, the electronic equipment 1000 may include an input module 1010, a processing module 1020, a memory module 1030 and an output module 1040.

The input module 1010 may be configured to receive a user's input. For example, the input module 1010 may be a keyboard, a microphone or a touch screen. The processing module 1020 may process data from the input module 1010 and/or the memory module 1030. For example, the processing module 1020 may be a central processing unit, and the central processing unit may include logic circuits that have any one or more of the above-mentioned spin logic devices. The memory module 1030 may include one or more of a DRAM, a ROM, a magnetic random access memory (MRAM), and a flash memory and it may also include any one or more of the above-mentioned spin logic devices. The memory module 1030 may store data to be used by the processing module 1020 such as operating systems, instructions, documents, audio and video data, or the like. The processing module 1020 may transfer processed data to the output module 1040 to be output. The output module 1040 may be for example a speaker, a display, or the like. In some embodiments, the output module 1040 and the input module 1010 may be integrated into one module such as a touch screen display. The input module 1010, the processing module 1020, the memory module 1030 and the output module 1040 may communicate with each other via a bus 1050. It is to be understood that the electronic equipment 1000 may be one of a cell phone, a laptop, a desktop computer, a tablet, a media player, a personal digital assistant, and a wearable electronic equipment.

Although particular embodiments have been described in detail, it should be understood that various other changes, substitutions, combinations, and alterations may be made hereto without departing from the spirit and scope of the present application. For example, although an embodiment has been described with reference to a plurality of layers included in a spin logic device, the spin logic device may include more or less layers, or a magnetic layer included in the spin logic device may be magnetized in a different direction. In addition, the spin logic device may operate using currents with a different magnitude or direction. It is intended that particular embodiments encompass all such changes, substitutions, variations, alterations, and modifications as falling within the spirit and scope of the appended claims.

What is claimed is:

1. A spin logic device comprising:
   a Spin Hall effect (SHE) layer formed of a conductive material having Spin Hall effect, the SHE layer including a first pair of connecting terminals formed on both sides thereof to receive a first logic input current and a second pair of connecting terminals formed on both sides thereof to receive a second logic input current, each of the first and second logic input currents being an in-plane current;
   a magnetic tunnel junction provided on the SHE layer and comprising a free magnetic layer in contact with the SHE layer, a barrier layer disposed on the free magnetic layer, and a reference magnetic layer disposed on the barrier layer, the magnetic tunnel junction configured pass a read current to allow determination of a logic state of the magnetic tunnel junction; and
   a current wiring in connection to the reference magnetic layer side of the magnetic tunnel junction, the current wiring being in cooperation with the SHE layer and configured to apply the read current through the magnetic tunnel junction between the current wiring and the SHE layer.

2. The spin logic device of claim 1 wherein the first logic input current and the second logic input current both are applied in a first direction to the SHE layer.

3. The spin logic device of claim 2 wherein the current wiring extends along a second direction that is perpendicular to the first direction to transfer a reversion current in the second direction.

4. The spin logic device of claim 2 further comprising:
   a magnetic biasing layer formed of a ferromagnetic material on a side of the SHE layer opposite to the free magnetic layer, the magnetic biasing layer having magnetization in the first direction and being ferromagnetically or anti-ferromagnetically coupled to the free magnetic layer via the SHE layer.

5. The spin logic device of claim 2 wherein the SHE layer is a SHE biasing layer for applying a magnetic biasing field in the first direction to the free magnetic layer.

6. The spin logic device of claim 5 wherein the SHE biasing layer is formed of IrMn, PtMn or AuMn.

7. The spin logic device of claim 5 wherein the SHE layer further receives a control current that is also an in-plane current.

8. The spin logic device of claim 7 wherein the control current is in the first direction or in a second direction that is perpendicular to the first direction.

9. The spin logic device of claim 7 wherein the spin logic device operates as a first type of logic gate when the control current has a first value, and the spin logic device operates as a second type of logic gate when the control current has a second value, the first value is different from the second value, and the first type of logic gate is different from the second type of logic gate.

10. The spin logic device of claim 1 wherein the SHE layer is formed of a material selected from a group consisting of Pt, Au, Ta, Pd, Ir, W, Bi, Pb, Hf, IrMn, PtMn, AuMn, $Bi_2Se_3$, $Bi_2Te_3$, Y, Nd, Sm, Eu, Gd, Te, Dy, Ho, Er, and Tm, and any combination thereof.

11. The spin logic device of claim 1 wherein the free magnetic layer and the reference magnetic layer both have perpendicular magnetization.

12. The spin logic device of claim 1 wherein the first logic input current is applied in a first direction to the SHE layer, and the second logic input current is applied in a second direction perpendicular to the first direction to the SHE layer.

13. A method of operating a spin logic device, the spin logic device comprising:
   a Spin Hall effect (SHE) layer formed of a conductive material having Spin Hall effect and configured to receive a first logic input current and a second logic input current, each being an in-plane current;

a magnetic tunnel junction provided on the SHE layer and comprising a free magnetic layer in contact with the SHE layer, a barrier layer disposed on the free magnetic layer, and a reference magnetic layer disposed on the barrier layer; and a current wiring in connection to the reference magnetic layer side of the magnetic tunnel junction, the current wiring being in cooperation with the SHE layer to apply a read current passing through the magnetic tunnel junction therebetween, the method comprising:

a logic operation step comprising:

applying the first logic input current and the second logic input current to the SHE layer; and applying the read current passing through the magnetic tunnel junction to read out the logic state of the magnetic tunnel junction; and a reset step carried out before or after the logic operation step to restore the magnetic tunnel junction to an initial state.

14. The method of claim 13 wherein applying the read current is carried out after applying the first logic input current and the second logic input current.

15. The method of claim 13 wherein the first logic input current flows through the SHE layer in a first direction, and the second logic input current flows through the SHE layer in a second direction perpendicular to the first direction.

16. The method of claim 13 wherein the first logic input current and the second logic input current both flow through the SHE layer in a first direction, and wherein the logic operation step further comprises applying a reversion current to the current wiring at the same time of applying the first logic input current and the second logic input current, the reversion current is in a second direction perpendicular to the first direction, and the reversion current does not flow through the magnetic tunnel junction.

17. The method of claim 13 wherein the SHE layer is a SHE biasing layer that applies a magnetic biasing field in a first direction to the free magnetic layer, and the first logic input current and the second logic input current both flow through the SHE biasing layer in the first direction, and wherein the logic operation step further comprises applying a control current to the SHE biasing layer at the same time of applying the first logic input current and the second logic input current, and the control current is an in-plane current applied in the first direction or in a second direction perpendicular to the first direction.

18. The method of claim 17 wherein the spin logic device operates as a first type of logic gate when the control current has a first value, and the spin logic device operates as a second type of logic gate when the control current has a second value, the first value is different from the second value, and the first type of logic gate is different from the second type of logic gate.

19. An electronic equipment comprising:

a processing module; and a memory module for storing data to be processed by the processing module, wherein at least one of the processing module and the memory module includes one or more spin logic devices, the spin logic device comprising:

a Spin Hall effect (SHE) layer formed of a conductive material having Spin Hall effect, the SHE layer including a first pair of connecting terminals formed on both sides thereof to receive a first logic input current and a second pair of connecting terminals formed on both sides thereof to receive a second logic input current, each of the first and second logic input currents being an in-plane current;

a magnetic tunnel junction provided on the SHE layer and comprising a free magnetic layer in contact with the SHE layer, a barrier layer disposed on the free magnetic layer, and a reference magnetic layer disposed on the barrier layer, the magnetic tunnel junction configured pass a read current to allow determination of a logic state of the magnetic tunnel junction; and a current wiring in connection to the reference magnetic layer side of the magnetic tunnel junction, the current wiring being in cooperation with the SHE layer and configured to apply the read current through the magnetic tunnel junction between the current wiring and the SHE layer.

20. The electronic equipment of claim 19 wherein the electronic equipment is one of a cell phone, a laptop, a desktop computer, a tablet, a media player, a personal digital assistant, and a wearable electronic equipment.

* * * * *